(12) United States Patent
Hirakawa et al.

(10) Patent No.: US 10,071,544 B2
(45) Date of Patent: Sep. 11, 2018

(54) SEPARATION APPARATUS, SEPARATION SYSTEM, AND SEPARATION METHOD

(71) Applicants: Tokyo Electron Limited, Tokyo (JP); INTEL CORPORATION, Santa Clara, CA (US)

(72) Inventors: Osamu Hirakawa, Koshi (JP); Masaru Honda, Koshi (JP); Akira Fukutomi, Koshi (JP); Takeshi Tamura, Koshi (JP); Jiro Harada, Koshi (JP); Kazutaka Noda, Kikuchi (JP); Xavier Francois Brun, Chandler, AZ (US)

(73) Assignees: Tokyo Electron Limited, Tokyo (JP); INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/693,151

(22) Filed: Dec. 4, 2012

(65) Prior Publication Data

US 2013/0146228 A1    Jun. 13, 2013

(30) Foreign Application Priority Data

Dec. 8, 2011 (JP) .................. 2011-269258
Nov. 7, 2012 (JP) .................. 2012-245474

(51) Int. Cl.
*B32B 38/10* (2006.01)
*H01L 21/67* (2006.01)
*B32B 43/00* (2006.01)

(52) U.S. Cl.
CPC ........ *B32B 38/10* (2013.01); *H01L 21/67051* (2013.01); *H01L 21/67092* (2013.01);
(Continued)

(58) Field of Classification Search
CPC ....... B32B 37/00; B32B 43/00; B32B 43/006; B32B 37/12; B32B 38/10; Y10T 156/1972; Y10T 156/1189
(Continued)

(56) References Cited

U.S. PATENT DOCUMENTS 4,632,718 A * 12/1986 Shimizu .................. 156/352
5,240,546 A *  8/1993 Shiga ..................... 156/378
(Continued)

FOREIGN PATENT DOCUMENTS

JP   H05-136016 A    6/1993
JP   H08-273992 A   10/1996
(Continued)

*Primary Examiner* — Philip Tucker
*Assistant Examiner* — Nickolas Harm
(74) *Attorney, Agent, or Firm* — Posz Law Group, PLC

(57) ABSTRACT

A separation apparatus for separating a superposed substrate in which a processing target substrate and a supporting substrate are joined together with an adhesive, into the processing target substrate and the supporting substrate, includes: a first holding unit which holds the processing target substrate; a second holding unit which holds the supporting substrate; a moving mechanism which relatively moves the first holding unit or the second holding unit in a horizontal direction; a load measurement unit which measures a load acting on the processing target substrate and the supporting substrate when the processing target substrate and the supporting substrate are separated; and a control unit which controls the moving mechanism based on the load measured by the load measurement unit.

15 Claims, 18 Drawing Sheets

(52) U.S. Cl.
CPC ...... *H01L 21/67288* (2013.01); *B32B 43/006* (2013.01); *B32B 2457/14* (2013.01); *Y10T 156/11* (2015.01); *Y10T 156/1189* (2015.01); *Y10T 156/19* (2015.01); *Y10T 156/1972* (2015.01)

(58) Field of Classification Search
USPC ................ 156/702, 718, 751, 763, 930, 941
See application file for complete search history.

(56) References Cited

U.S. PATENT DOCUMENTS

| | | | |
|---|---|---|---|
| 5,423,931 A * | 6/1995 | Inoue et al. | 156/94 |
| 6,360,940 B1 * | 3/2002 | Bolde et al. | 228/264 |
| 6,869,498 B1 * | 3/2005 | Tsai et al. | 156/345.13 |
| 2005/0263251 A1 * | 12/2005 | Mizuno | 156/379.6 |
| 2006/0213537 A1 * | 9/2006 | Atalla | 134/18 |
| 2009/0056424 A1 * | 3/2009 | Cohen et al. | 73/54.37 |
| 2009/0218560 A1 * | 9/2009 | Flaim et al. | 257/9 |
| 2010/0251832 A1 * | 10/2010 | Kirkpatrick | 73/862.191 |
| 2011/0253315 A1 * | 10/2011 | George | 156/718 |

FOREIGN PATENT DOCUMENTS

| | | |
|---|---|---|
| JP | 09-167724 A | 6/1997 |
| JP | 2002-100595 A | 4/2002 |

\* cited by examiner

SEPARATION APPARATUS, SEPARATION SYSTEM, AND SEPARATION METHOD

BACKGROUND OF THE INVENTION

1. Field of the Invention

The present invention relates to a separation apparatus for separating a superposed substrate into a processing target substrate and a supporting substrate, a separation system including the separation apparatus, and a separation method using the separation apparatus.

2. Description of the Related Art

In recent years, for example, in a manufacturing process of a semiconductor device, the diameter of a semiconductor wafer (hereinafter, referred to as a "wafer") increasingly becomes larger. Further, the wafer is required to be thinner in a specific process such as mounting. When a thin wafer with a large diameter is transferred or subjected to polishing as it is, warpage or break can occur in the wafer. Therefore, in order to reinforce the wafer, for example, bonding the wafer to a wafer being a supporting substrate or a glass substrate is performed. The predetermined processing such as polishing and the like are performed on the wafer with the wafer being joined with the supporting substrate as described above, and then the wafer and the supporting substrate are separated.

The separation of the wafer and the supporting substrate is performed using, for example, a separation apparatus. The separation apparatus has, for example, a first holder that holds the wafer, a second holder that holds the supporting substrate, and a nozzle that jets liquid between the wafer and the supporting substrate. Then, this separation apparatus separates the wafer and the supporting substrate by jetting liquid to between the joined wafer and supporting substrate from a nozzle at a jetting pressure greater than the joint strength between the wafer and the supporting substrate, preferably, a jetting pressure twice or greater than the joint strength (Japanese Laid-open Patent Publication No. H9-167724).

SUMMARY OF THE INVENTION

However, in the case of using the separation apparatus described in Patent Document 1, the liquid is jetted at a high jetting pressure and may therefore damage the wafer or the supporting substrate. In particular, the wafer has been made thinner and is thus susceptible to damage.

Hence, to avoid the damage to the wafer or the supporting substrate, it is conceivable to jet liquid at a low jetting pressure so as to separate the wafer and the supporting substrate. However, in this case, a lot of time is required to separate the wafer and the supporting substrate.

The present invention has been made in consideration of the above point, and an object thereof is to appropriately and efficiently perform separation processing of a processing target substrate and a supporting substrate.

To achieve the above object, the present invention is a separation apparatus for separating a superposed substrate in which a processing target substrate and a supporting substrate are joined together with an adhesive, into the processing target substrate and the supporting substrate, the separation apparatus including: a first holding unit which holds the processing target substrate; a second holding unit which holds the supporting substrate; a moving mechanism which relatively moves the first holding unit or the second holding unit in a horizontal direction; a load measurement unit which measures a load acting on the processing target substrate and the supporting substrate when the processing target substrate and the supporting substrate are separated; and a control unit which controls the moving mechanism based on the load measured by the load measurement unit.

According to the present invention, the moving mechanism relatively moves the first holding unit or the second holding unit in a horizontal direction to separate the processing target substrate and the supporting substrate. Then, a load acting on the processing target substrate and the supporting substrate is measured by the load measurement unit when the processing target substrate and the supporting substrate are separated, and the moving mechanism is controlled based on the load measured by the load measurement unit. Since the moving mechanism can be feedback-controlled as described above, an appropriate load can be made to act on the processing target substrate and the supporting substrate. As a result, the damage to the processing target substrate and the supporting substrate can be suppressed. Further, it is possible to optimize the time required to separate the processing target substrate and the supporting substrate, thereby improving the throughput of the separation processing. As described above, according to the present invention, it is possible to appropriately and efficiently perform the separation processing of the processing target substrate and the supporting substrate.

The present invention according to another aspect is a separation system including a separation apparatus for separating a superposed substrate in which a processing target substrate and a supporting substrate are joined together with an adhesive, into the processing target substrate and the supporting substrate, the separation apparatus including: a first holding unit which holds the processing target substrate; a second holding unit which holds the supporting substrate; a moving mechanism which relatively moves the first holding unit or the second holding unit in a horizontal direction; a load measurement unit which measures a load acting on the processing target substrate and the supporting substrate when the processing target substrate and the supporting substrate are separated; and a control unit which controls the moving mechanism based on the load measured by the load measurement unit, the separation system including: a processing station including the separation apparatus, a first cleaning apparatus which cleans the processing target substrate separated in the separation apparatus, and a second cleaning apparatus which cleans the supporting substrate separated in the separation apparatus; a transfer-in/out station which transfers in/out the processing target substrate, the supporting substrate, or the superposed substrate to/from processing station; and a transfer apparatus which transfers the processing target substrate, the supporting substrate, or the superposed substrate between the processing station and the transfer-in/out station.

The present invention according to still another aspect is a separation method of separating a superposed substrate in which a processing target substrate and a supporting substrate are joined together with an adhesive, into the processing target substrate and the supporting substrate, the separation method including: relatively moving a first holding unit which holds the processing target substrate or a second holding unit which holds the supporting substrate in a horizontal direction by a moving mechanism to separate the processing target substrate and the supporting substrate; measuring a load acting on the processing target substrate and the supporting substrate by a load measurement unit when separating the processing target substrate and the supporting substrate; and controlling the moving mechanism based on the load measured by the load measurement unit.

According to the present invention, it is possible to appropriately and efficiently perform separation processing of a processing target substrate and a supporting substrate.

DETAILED DESCRIPTION OF THE INVENTION

Figure 1:
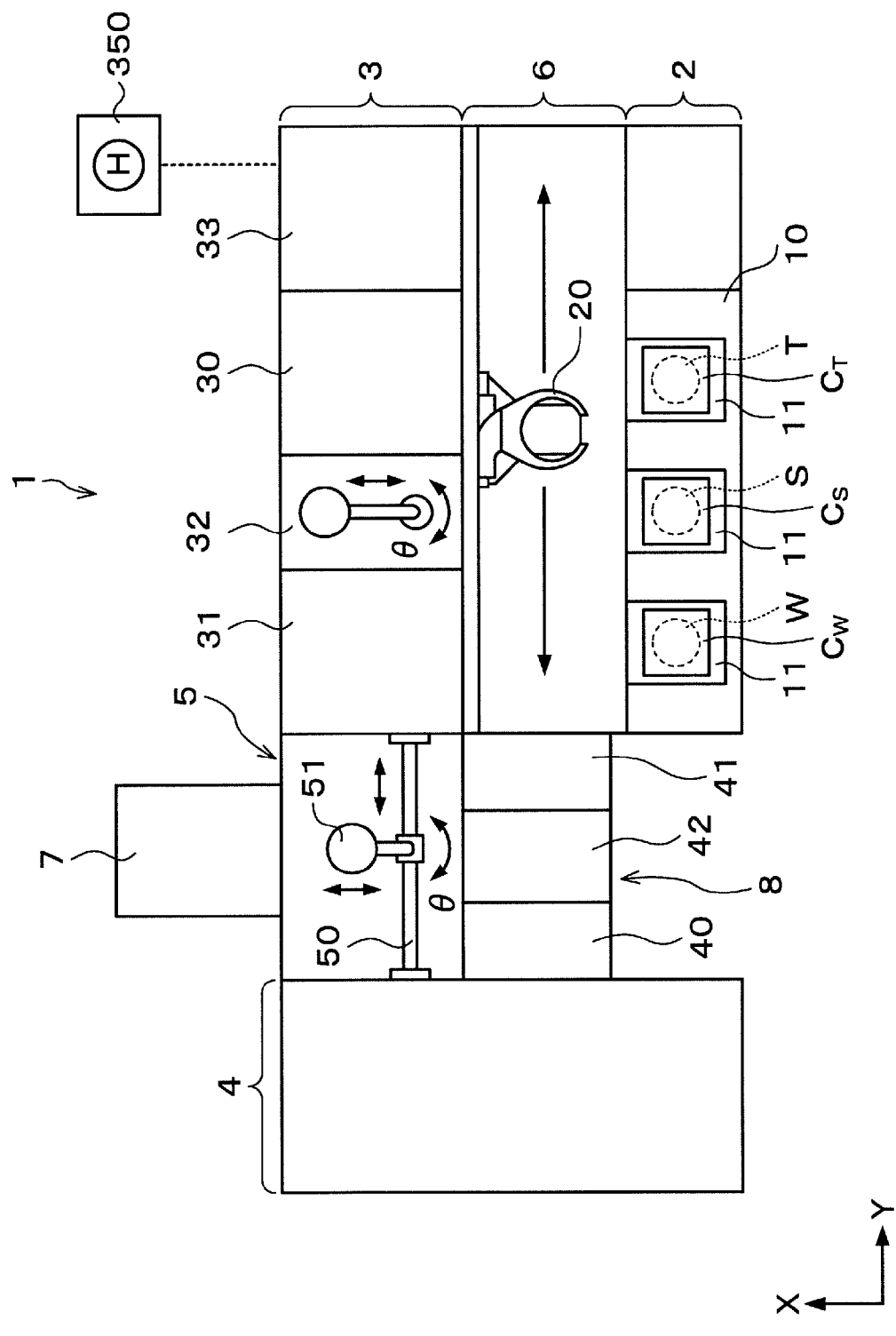
FIG. 1 is a plan view illustrating the outline of a configuration of a separation system according to an embodiment.

Hereinafter, embodiments of the present invention will be described. FIG. 1 is a plan view illustrating the outline of a configuration of a separation system 1 according to an embodiment.

Figure 2:
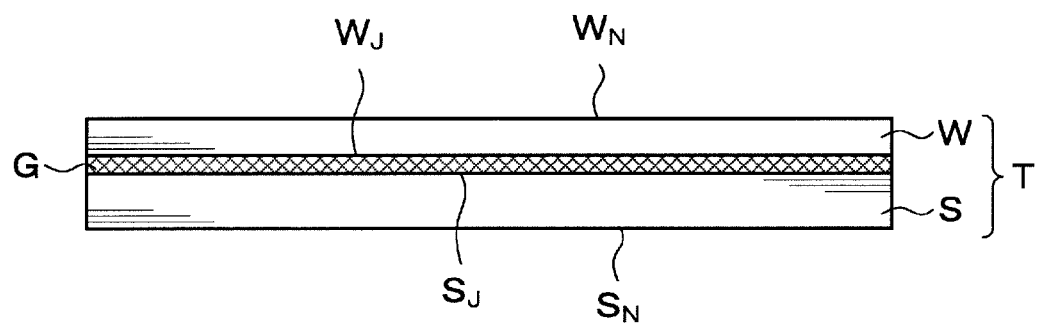
FIG. 2 is a side view of a processing target wafer and a supporting wafer.

In the separation system 1, a superposed wafer T as a superposed substrate in which a processing target wafer W as a processing target substrate and a supporting wafer S as a supporting substrate are joined together with an adhesive G as illustrated in FIG. 2 is separated into the processing target wafer W and the supporting wafer S. Hereinafter, in the processing target wafer W, the surface to be joined with the supporting wafer S via the adhesive G is referred to as a "joint surface $W_J$," and the surface opposite to the joint surface $W_J$ is referred to as "a non-joint surface $W_N$." Similarly, in the supporting wafer S, the surface to be joined with the processing target wafer W via the adhesive G is referred to as a "joint surface $S_J$," and the surface opposite to the joint surface $S_J$ is referred to as "a non-joint surface $S_N$." Note that the processing target wafer W is a wafer which will be a product, and a plurality of devices including a plurality of electronic circuits and the like have been formed, for example, on the joint surface $W_J$. Further, in the processing target wafer W, for example, the non-joint surface $W_N$ has been subjected to polishing to be thinned (for example, with a thickness of 50 µm to 100 µm). The supporting wafer S is a wafer which has the same diameter as that of the processing target wafer W and supports the processing target wafer W. Note that a case of using a wafer as the supporting substrate will be described in this embodiment, but other substrates such as, for example, a glass substrate and the like may be used.

The separation system 1 has, as illustrates in FIG. 1, a configuration in which a transfer-in/out station 2 into/from which cassettes $C_W$, $C_S$, $C_T$ capable of housing a plurality of processing target wafers W, a plurality of supporting wafers S, and a plurality of superposed wafers T respectively are transferred from/to the outside, a processing station 3 including various processing and treatment apparatuses that perform predetermined processing and treatment on the processing target wafer W, the supporting wafer S, and the superposed wafer T, and an interface station 5 that delivers the processing target wafer W to/from a post-processing station 4 adjacent to the processing station 3, are integrally connected.

The transfer-in/out station 2 and the processing station 3 are arranged side by side in an X-direction (a top-bottom direction in FIG. 1). Between the transfer-in/out station 2 and the processing station 3, a wafer transfer region 6 is formed. The interface station 5 is located on a Y-direction negative direction side (a left direction side in FIG. 1) of the processing station 3. On an X-direction positive direction side (an upper direction side in FIG. 1) of the interface station 5, an inspection apparatus 7 that inspects the processing target wafer W before being delivered to the post-processing station 4 is disposed. Further, on the opposite to the inspection apparatus 7 across the interface station 5, namely, on an X-direction negative direction side (a lower direction side in FIG. 1) of the interface station 5, a post-inspection cleaning station 8 that cleans the joint surface $W_J$ and the non-joint surface $W_N$ of the processing target wafer W after inspection and reverses the front and rear surfaces of the processing target wafer W is disposed.

In the transfer-in/out station 2, a cassette mounting table 10 is provided. On the cassette mounting table 10, a plurality of, for example, three cassette mounting plates 11 are provided. The cassette mounting plates 11 are arranged side by side in a line in a Y-direction (a right-left direction in FIG. 1). On these cassette mounting plates 11, the cassettes $C_W$, $C_S$, $C_T$ can be mounted when the cassettes $C_W$, $C_S$, $C_T$ are transferred in/out from/to the outside of the separation system 1. As described above, the transfer-in/out station 2 is configured to be capable of holding the plurality of processing target wafers W, the plurality of supporting wafers S, and the plurality of superposed wafers T. Note that the number of cassette mounting plates 11 is not limited to this embodiment but can be arbitrarily determined. Further, the plurality of superposed wafers T transferred into the transfer-in/out station 2 have been subjected to inspection in advance and discriminated between a superposed wafer T including a normal processing target wafer W and a superposed wafer T including a defective processing target wafer W.

In the wafer transfer region 6, a first transfer apparatus 20 is disposed. The first transfer apparatus 20 has, for example, a transfer arm that is movable, for example, in the vertical direction, the horizontal directions (the X-direction, the Y-direction), and around the vertical axis. The first transfer apparatus 20 can move in the wafer transfer region 6 and transfer the processing target wafer W, the supporting wafer S, the superposed wafer T between the transfer-in/out station 2 and the processing station 3.

The processing station 3 has a separation apparatus 30 that separates the superposed wafer T into the processing target wafer W and the supporting wafer S. On the Y-direction negative direction side (the left direction side in FIG. 1) of the separation apparatus 30, a first cleaning apparatus 31 that cleans the separated processing target wafer W is disposed. Between the separation apparatus 30 and the first cleaning apparatus 31, a second transfer apparatus 32 is provided. Further, on the Y-direction positive direction side (the right direction side in FIG. 1) of the separation apparatus 30, a second cleaning apparatus 33 that cleans the separated supporting wafer S is disposed. As described above, in the processing station 3, the first cleaning apparatus 31, the second transfer apparatus 32, the separation apparatus 30, and the second cleaning apparatus 33 are arranged side by side in this order from the interface station 5 side.

The inspection apparatus 7 inspects the presence or absence of a residue of the adhesive G on the processing target wafer W separated by the separation apparatus 30. Further, the post-inspection cleaning station 8 cleans the processing target wafer W for which a residue of the adhesive G has been checked in the inspection apparatus 7. The post-inspection cleaning station 8 has a joint surface cleaning apparatus 40 that cleans the joint surface $W_J$ of the processing target wafer W, a non-joint surface cleaning apparatus 41 that cleans the non-joint surface $W_N$ of the processing target wafer W, and a reversing apparatus 42 that reverses the front and rear surfaces of the processing target wafer W. The joint surface cleaning apparatus 40, the reversing apparatus 42, and the non-joint surface cleaning apparatus 41 are arranged side by side in the Y-direction from the post-processing station 4 side.

In the interface station 5, a third transfer apparatus 51 which is movable on a transfer path 50 that extends in the Y-direction is provided. The third transfer apparatus 51 is also movable in the vertical direction and around the vertical axis (in a θ-direction), and thus can transfer the processing target wafer W between the processing station 3, the post-processing station 4, the inspection apparatus 7, and the post-inspection cleaning station 8.

Note that in the post-processing station 4, predetermined post-processing is performed on the processing target wafer W separated in the processing station 3. As the predetermined post-processing, for example, processing of mounting the processing target wafer W, processing of performing inspection of electric characteristics of the devices on the processing target wafer W, processing of dicing the processing target wafer W into chips are performed.

Figure 3:
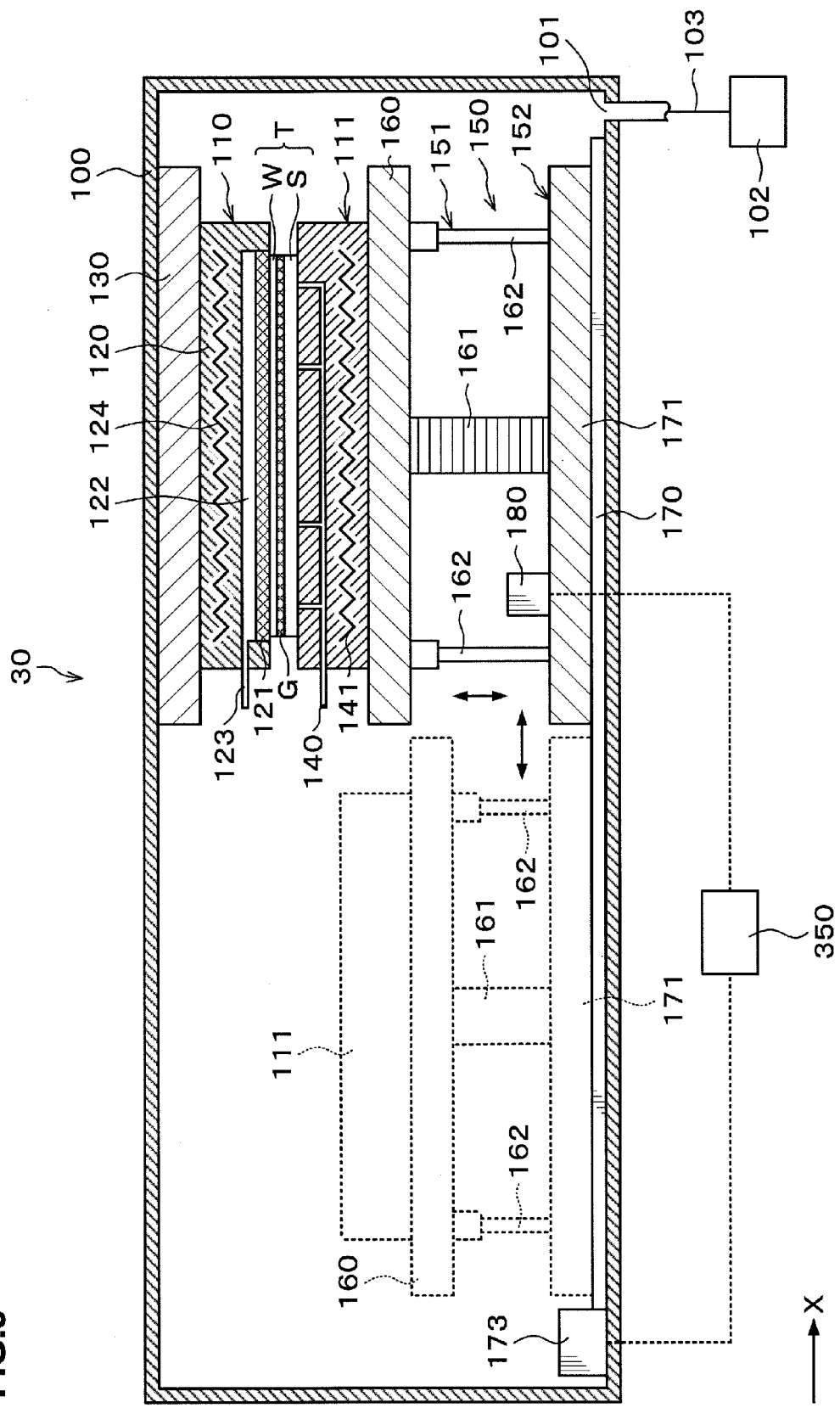
FIG. 3 is a longitudinal sectional view illustrating the outline of a configuration of a separation apparatus.

Next, the configuration of the above-described separation apparatus 30 will be described. The separation apparatus 30 has a processing container 100 capable of hermetically closing inside thereof as illustrated in FIG. 3. In the side surface of the processing container 100, a transfer-in/out port (not illustrated) for the processing target wafer W, the supporting wafer S, and the superposed wafer T is formed, and an opening/closing shutter (not illustrated) is provided at the transfer-in/out port.

At the bottom surface of the processing container 100, an exhaust port 101 exhausting the atmosphere in the processing container 100 is formed. An exhaust pipe 103 communicating with an exhaust apparatus 102 such as, for example, a vacuum pump is connected to the exhaust port 101.

Inside the processing container 100, a first holding unit 110 that suction-holds the processing target wafer W by its lower surface, and a second holding unit 111 that mounts and holds the supporting wafer S on its upper surface are provided. The first holding unit 110 is provided above the second holding unit 111 and disposed to face the second holding unit 111. In other words, inside the processing container 100, the separation processing is performed on the superposed wafer T with the processing target wafer W arranged on the upper side and the supporting wafer S arranged on the lower side.

For the first holding unit 110, for example, a porous chuck is used. The first holding unit 110 has a main body unit 120 in a flat plate shape. On the lower surface side of the main body unit 120, a porous 121 being a porous body is provided. The porous 121 has, for example, substantially the same diameter as that of the processing target wafer W and is in abutment with the non-joint surface $W_N$ of the processing target wafer W. Note that as the porous 121, for example, silicon carbide is used.

Further, a suction space 122 is formed inside the main body unit 120 and above the porous 121. The suction space 122 is formed, for example, in a manner to cover the porous 121. To the suction space 122, a suction pipe 123 is connected. The suction pipe 123 is connected to a negative pressure generating apparatus (not illustrated) such as, for example, a vacuum pump. Then, the non-joint surface $W_N$ of the processing target wafer is sucked from the suction pipe 123 via the suction space 122 and the porous 121 so that the processing target wafer W is suction-held by the first holding unit 110.

Further, inside the main body unit 120 and above the suction space 122, a heating mechanism 124 heating the processing target wafer W is provided. For the heating mechanism 124, for example, a heater is used.

On the upper surface of the first holding unit 110, a supporting plate 130 that supports the first holding unit 110 is provided. The supporting plate 130 is supported on the ceiling surface of the processing container 100. Note that the supporting plate 130 in this embodiment may be omitted so that the first holding unit 110 is supported in abutment with the ceiling surface of the processing container 100.

Inside the second holding unit 111, a suction pipe 140 for suction-holding the supporting wafer S is provided. The suction pipe 140 is connected to a negative pressure generating apparatus (not illustrated) such as, for example, a vacuum pump.

Further, inside the second holding unit 111, a heating mechanism 141 heating the supporting wafer S is provided. For the heating mechanism 141, for example, a heater is used.

Below the second holding unit 111, a moving mechanism 150 that moves the second holding unit 111 and the supporting wafer S in the vertical direction and the horizontal direction is provided. The moving mechanism 150 has a vertical moving unit 151 that moves the second holding unit 111 in the vertical direction and a horizontal moving unit 152 that moves the second holding unit 111 in the horizontal direction.

The vertical moving unit 151 has a supporting plate 160 that supports the lower surface of the second holding unit 111, a driving unit 161 that raises and lowers the supporting plate 160 to cause the first holding unit 110 and the second holding unit 111 to approach to and separate from each other in the vertical direction, and supporting members 162 that support the supporting plate 160. The driving unit 161 has, for example, a ball screw (not illustrated) and a motor (not illustrated) that turns the ball screw. Further, the supporting members 162 are configure to be capable of expansion and contraction in the vertical direction, and provided, for example, at four locations between the supporting plate 160 and a later-described supporting body 171.

The horizontal moving unit 152 has a pair of rails 170, 170 that extend along an X-direction (a right-left direction in FIG. 4), the supporting body 171 attached to the rails 170, a ball screw 172 that is coupled to the supporting body 171 and extends along the rails 170, and a driving unit 173 that turns the ball screw 172. The driving unit 173 has, for example, a motor (not illustrated) therein and can turn the ball screw 172 to move the supporting body 171 along the rails 170.

Figure 4:
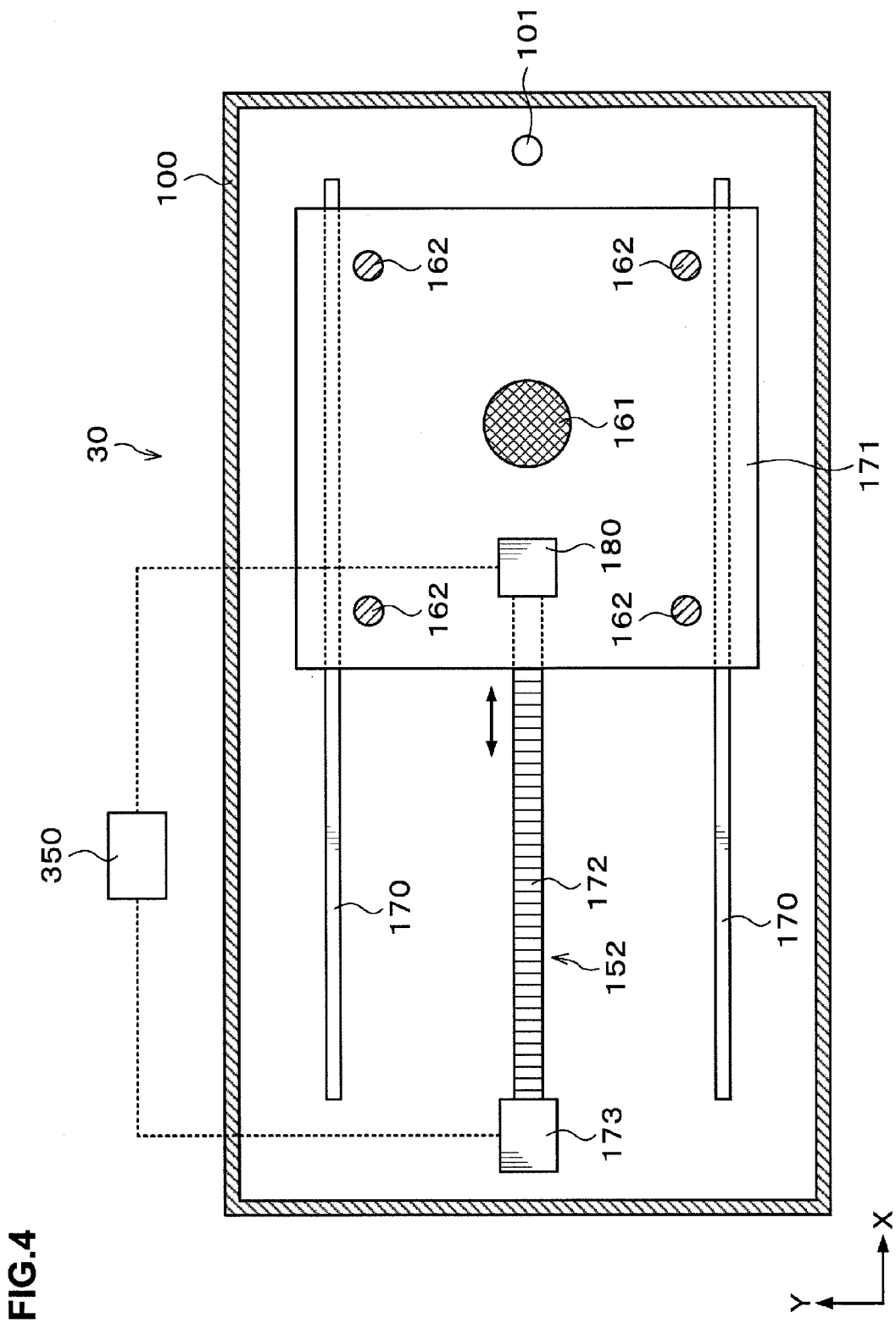
FIG. 4 is a transverse sectional view illustrating the outline of the configuration of the separation apparatus.

On the supporting body 171, a load cell 180 as a load measurement unit that measures the load acting on the processing target wafer W and the supporting wafer S at separation of the processing target wafer W and the supporting wafer S is provided as illustrated in FIG. 3 and FIG. 4. The load measured by the load cell 180 is then outputted to a later-described control unit 350. The control unit 350 controls the rotation speed (or torque) of the driving unit 173 based on the load measured by the load cell 180 so that the load acting on the processing target wafer W and the supporting wafer S is a constant desired load. Note that a load range that can be measured by the load cell 180 is a range including at least the load acting on the processing target wafer W and the supporting wafer S, for example, 0 N to 2000 N.

Note that below the second holding unit 111, raising and lowering pins (not illustrated) for supporting the superposed wafer T or the supporting wafer S from below and raising and lowering it are provided. The raising and lowering pins are configured to be able to pass through through holes (not illustrated) formed in the second holding unit 111 and project from the upper surface of the second holding unit 111.

Figure 5:
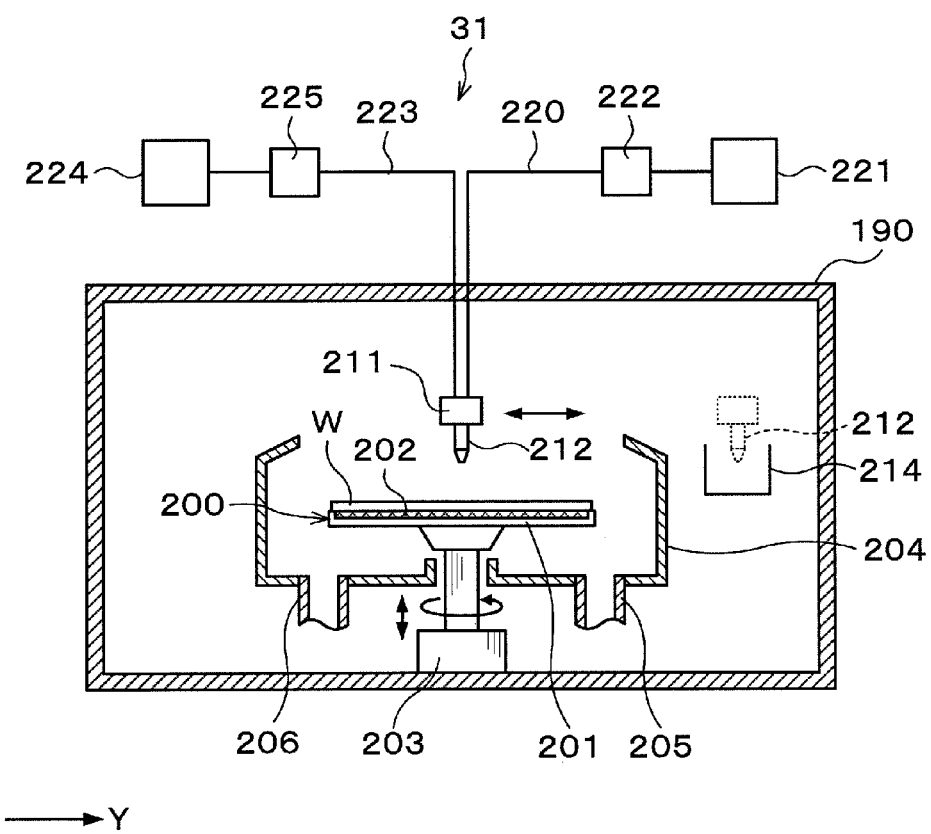
FIG. 5 is a longitudinal sectional view illustrating the outline of a configuration of a first cleaning apparatus.

Next, the configuration of the above-described first cleaning apparatus 31 will be described. The first cleaning apparatus 31 has a treatment container 190 capable of hermetically closing inside thereof as illustrated in FIG. 5. In a side surface of the treatment container 190, a transfer-in/out port (not illustrated) for the processing target wafer W is formed, and an opening/closing shutter (not illustrated) is provided at the transfer-in/out port.

At a central portion inside the treatment container 190, a porous chuck 200 that holds and rotates the processing target wafer W thereon is provided. The porous chuck 200 has a main body unit 201 in a flat plate shape and a porous 202 being a porous body provided on the upper surface side of the main body unit 201. The porous 202 has, for example, substantially the same diameter as that of the processing target wafer W and is in abutment with the non-joint surface $W_N$ of the processing target wafer W. Note that as the porous 202, for example, silicon carbide is used. A suction pipe (not illustrated) is connected to the porous 202 and sucks the non-joint surface $W_N$ of the processing target wafer W from the suction pipe via the porous 202 and thereby can suction-hold the processing target wafer W on the porous chuck 200.

Below the porous chuck 200, a chuck driving unit 203 equipped with, for example, a motor is provided. The porous chuck 200 can rotate at a predetermined speed by means of the chuck driving unit 203. Further, the chuck driving unit 203 is provided with a raising and lowering driving source such as, for example, a cylinder so that the porous chuck 200 can freely rise and lower.

Around the porous chuck 200, a cup 204 is provided that receives and recovers liquid splashing or dropping from the processing target wafer W. A drain pipe 205 that drains the recovered liquid and an exhaust pipe 206 that vacuums and exhausts the atmosphere inside the cup 204 are connected to the lower surface of the cup 204.

Figure 6:
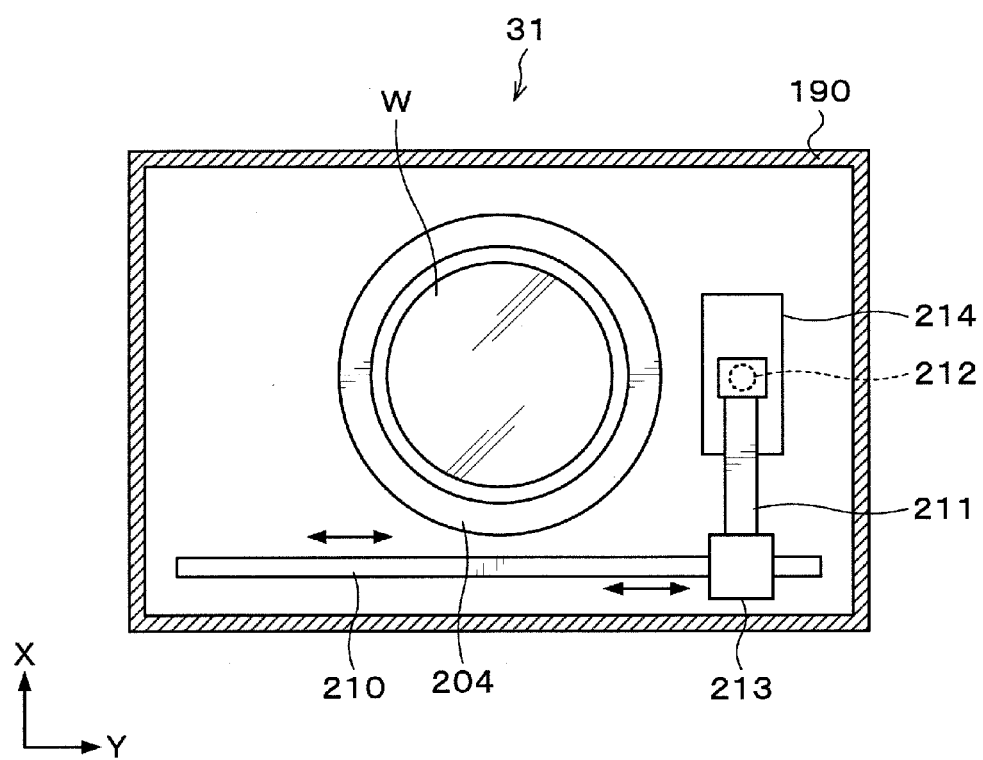
FIG. 6 is a transverse sectional view illustrating the outline of the configuration of the first cleaning apparatus.

As illustrated in FIG. 6, on an X-direction negative direction (a downward direction in FIG. 6) side of the cup 204, a rail 210 that extends along a Y-direction (a right-left direction in FIG. 6) is formed. The rail 210 is formed, for example, from a Y-direction negative direction (a left direction in FIG. 6) side outer position of the cup 204 to a Y-direction positive direction (a right direction in FIG. 6) side outer position. On the rail 210, an arm 211 is attached.

On the arm 211, a cleaning solution nozzle 212 that supplies a cleaning solution, for example, an organic solvent being a solvent for the adhesive G to the processing target wafer W is supported as illustrated in FIG. 5 and FIG. 6. The arm 211 is movable on the rail 210 by means of a nozzle driving unit 213 illustrated in FIG. 6. Thus, the cleaning solution nozzle 212 can move from a waiting section 214 provided at the Y-direction positive direction side outer position of the cup 204 to a position above a central portion of the processing target wafer W in the cup 204, and further move in the diameter direction of the processing target wafer W above the processing target wafer W. Further, the arm 211 can freely rise and lower by means of the nozzle driving unit 213 to be able to adjust the height of the cleaning solution nozzle 212.

For the cleaning solution nozzle 212, for example, a two-fluid nozzle is used. To the cleaning solution nozzle 212, a supply pipe 220 that supplies the cleaning solution to the cleaning solution nozzle 212 is connected as illustrated in FIG. 5. The supply pipe 220 communicates with a cleaning solution supply source 221 that stores the cleaning solution therein. Along the supply pipe 220, a supply equipment group 222 is provided which includes a valve, a flow regulator and so on that control the flow of the cleaning solution. Further, a supply pipe 223 that supplies an inert gas, for example, a nitrogen gas to the cleaning solution nozzle 212 is connected to the cleaning solution nozzle 212. The supply pipe 223 communicates with a gas supply source 224 that stores the inert gas therein. Along the supply pipe 223, a supply equipment group 225 is provided which includes a valve, a flow regulator and so on that control the flow of the inert gas. Then, the cleaning solution and the inert gas are mixed in the cleaning solution nozzle 212 and supplied from the cleaning solution nozzle 212 to the processing target wafer W. Note that the mixture of the cleaning solution and the inert gas is sometimes referred to simply as a "cleaning solution" hereinafter.

Incidentally, below the porous chuck 200, raising and lowering pins (not illustrated) for supporting the processing target wafer W from below and raising and lowering it may be provided. In this case, the raising and lowering pins are configured to be able to pass through through holes (not illustrated) formed in the porous chuck 200 and project from the upper surface of the porous chuck 200. Then, in place of raising and lowering the porous chuck 200, the raising and lowering pins are raised or lowered to deliver the processing target wafer W to/from the porous chuck 200.

Note that the configurations of the joint surface cleaning apparatus 40 and the non-joint surface cleaning apparatus 41 in the post-inspection cleaning station 8 are the same as the configuration of the above-described first cleaning apparatus 31, and therefore the description thereof is omitted.

Figure 7:
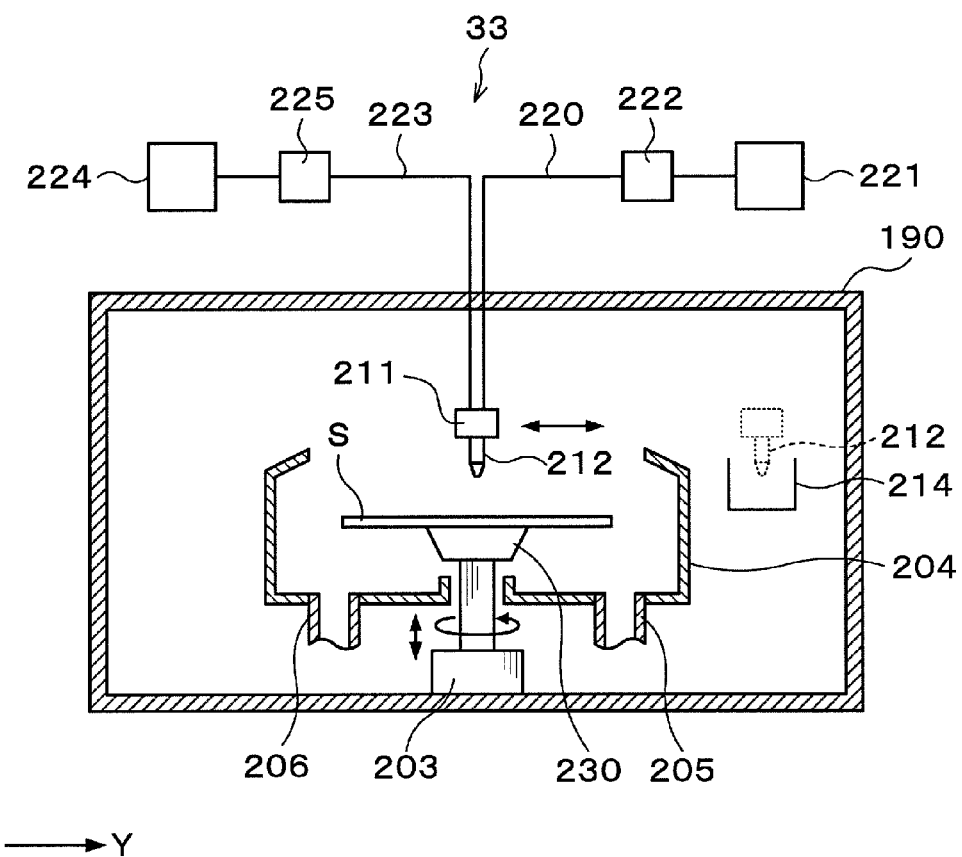
FIG. 7 is a longitudinal sectional view illustrating the outline of a configuration of a second cleaning apparatus.

Further, the configuration of the second cleaning apparatus 33 is substantially the same as the configuration of the above-described first cleaning apparatus 31. In the second cleaning apparatus 33, a spin chuck 230 is provided as illustrated in FIG. 7 in place of the porous chuck 200 of the first cleaning apparatus 31. The spin chuck 230 has a horizontal upper surface, and a suction port (not illustrated) for sucking, for example, the supporting wafer S is provided in the upper surface. By suction through the suction port, the supporting wafer S can be suction-held on the spin chuck 230. The other configuration of the second cleaning apparatus 33 is the same as that of the above-described first cleaning apparatus 31, and therefore the description thereof is omitted.

Incidentally, in the second cleaning apparatus 33, a back rinse nozzle (not illustrated) that jets a cleaning solution toward the rear surface of the supporting wafer S, namely, the non-joint surface $S_N$ may be provided below the spin chuck 230. The cleaning solution jetted from the back rinse nozzle cleans the non-joint surface $S_N$ of the supporting wafer S and the outer peripheral portion of the supporting wafer S.

Figure 8:
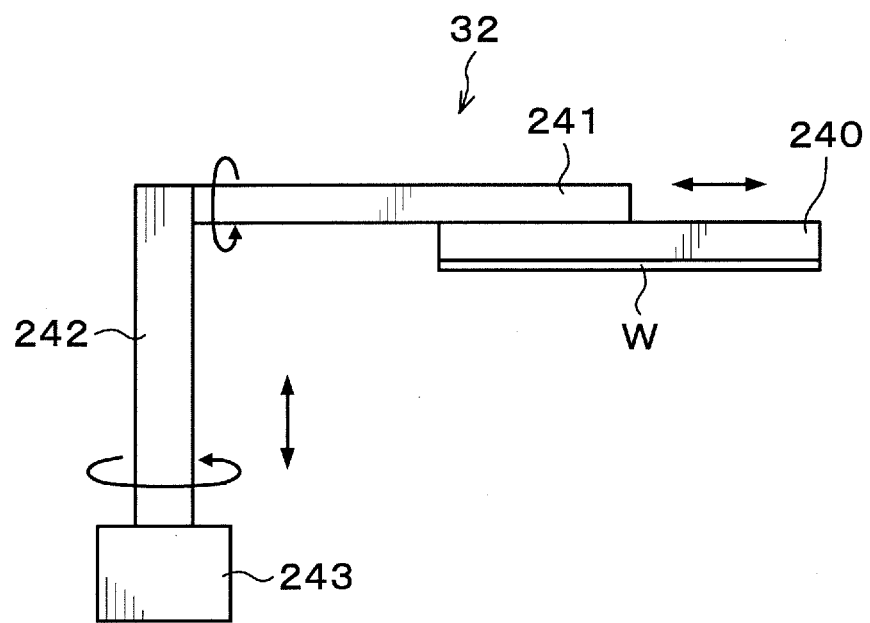
FIG. 8 is a side view illustrating the outline of a configuration of a second transfer apparatus.

Next, the configuration of the above-described second transfer apparatus 32 will be described. The second transfer apparatus 32 has a Bernoulli chuck 240 that holds the processing target wafer W as illustrated in FIG. 8. The Bernoulli chuck 240 is supported by a supporting arm 241. The supporting arm 241 is supported by a first driving unit 242. By means of the first driving unit 242, the supporting arm 241 can turn around the horizontal axis and expand and contract in the horizontal direction. At a lower portion of the first driving unit 242, a second driving unit 243 is provided. By means of the second driving unit 243, the first driving unit 242 can rotate around the vertical axis and rise and lower in the vertical direction.

Note that the third transfer apparatus 51 has the same configuration as that of the above-described second transfer apparatus 32, and therefore the description thereof is omitted. However, the second driving unit 243 of the third transfer apparatus 51 is attached to the transfer path 50 illustrated in FIG. 1 so that the third transfer apparatus 51 is movable on the transfer path 50.

Figure 9:
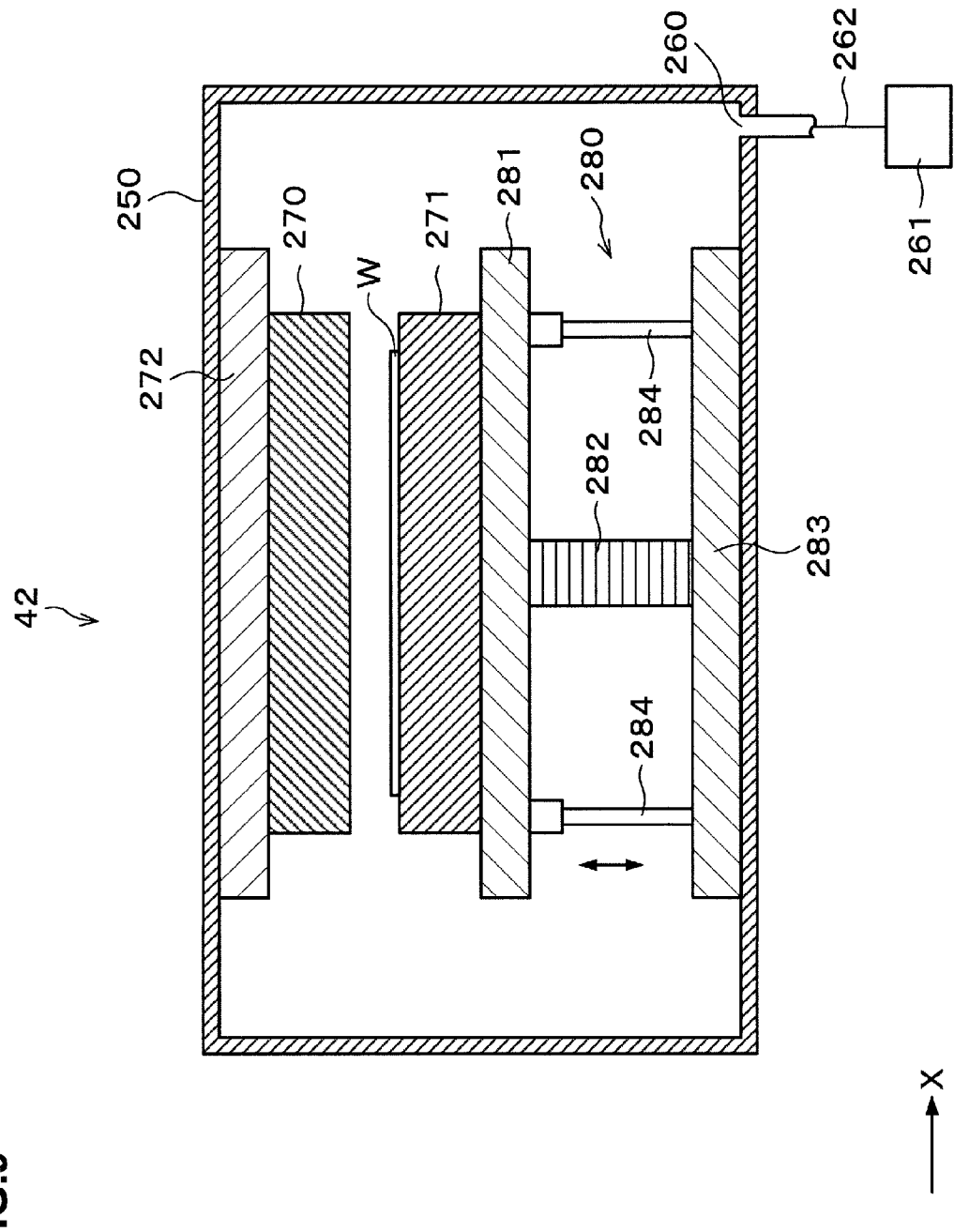
FIG. 9 is a longitudinal sectional view illustrating the outline of a configuration of a reversing apparatus.

Next, the configuration of the aforementioned reversing apparatus 42 will be described. The reversing apparatus 42 has a processing container 250 housing a plurality of devices therein as illustrated in FIG. 9. In a side surface of the processing container 250, a transfer-in/out port (not illustrated) is formed for transferring in/out the processing target wafer W by the third transfer apparatus 51, and an opening/closing shutter (not illustrated) is provided at the transfer-in/out port (not illustrated).

At the bottom surface of the processing container 250, an exhaust port 260 that exhausts the atmosphere in the processing container 250 is formed. To the exhaust port 260, an exhaust pipe 262 is connected which communicating with an exhaust apparatus 261 such as a vacuum pump.

Inside the processing container 250, a first holding unit 270 that holds the processing target wafer W on its lower surface and a second holding unit 271 that holds the processing target wafer W on its upper surface are provided. The first holding unit 270 is provided above the second holding unit 271 and disposed to face the second holding unit 271. The first holding unit 270 and the second holding unit 271 have substantially the same diameter as that of, for example, the processing target wafer W. For the first holding unit 270 and the second holding unit 271, Bernoulli chucks are used. This enables each of the first holding unit 270 and the second holding unit 271 to hold the whole one surface of the processing target wafer W in a non-contact manner.

On the upper surface of the first holding unit 270, a supporting plate 272 that supports the first holding unit 270 is provided. Note that the supporting plate 272 in this embodiment may be omitted so that the first holding unit 270 is supported in abutment with the ceiling surface of the processing container 250.

Below the second holding unit 271, a moving mechanism 280 that moves the second holding unit 271 in the vertical direction is provided. The moving mechanism 280 has a supporting plate 281 that supports the lower surface of the second holding unit 271 and a driving unit 282 that raises and lowers the supporting plate 281 to cause the first holding unit 270 and the second holding unit 271 to approach to and separate from each other in the vertical direction. The driving unit 282 is supported by a supporting body 283 provided at the bottom surface of the processing container 250. Further, supporting members 284 that support the supporting plate 281 are provided on the upper surface of the supporting body 283. The supporting members 284 are configured to be capable of expansion and contraction in the vertical direction and to be able to freely expand and contact when the driving unit 282 raises and lowers the supporting plate 281.

Figure 10:
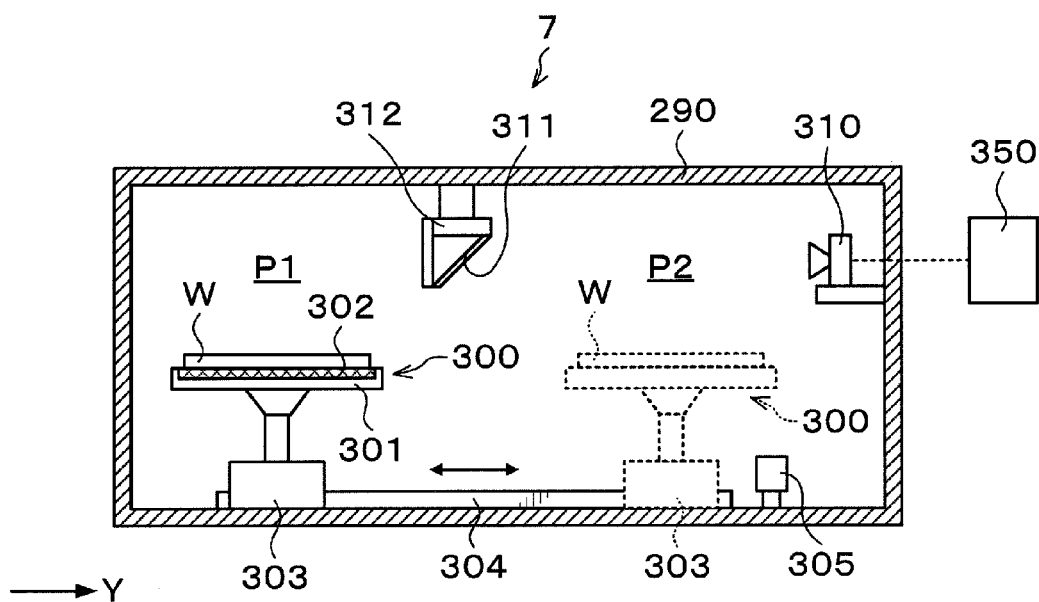
FIG. 10 is a longitudinal sectional view illustrating the outline of a configuration of an inspection apparatus.
Figure 11:
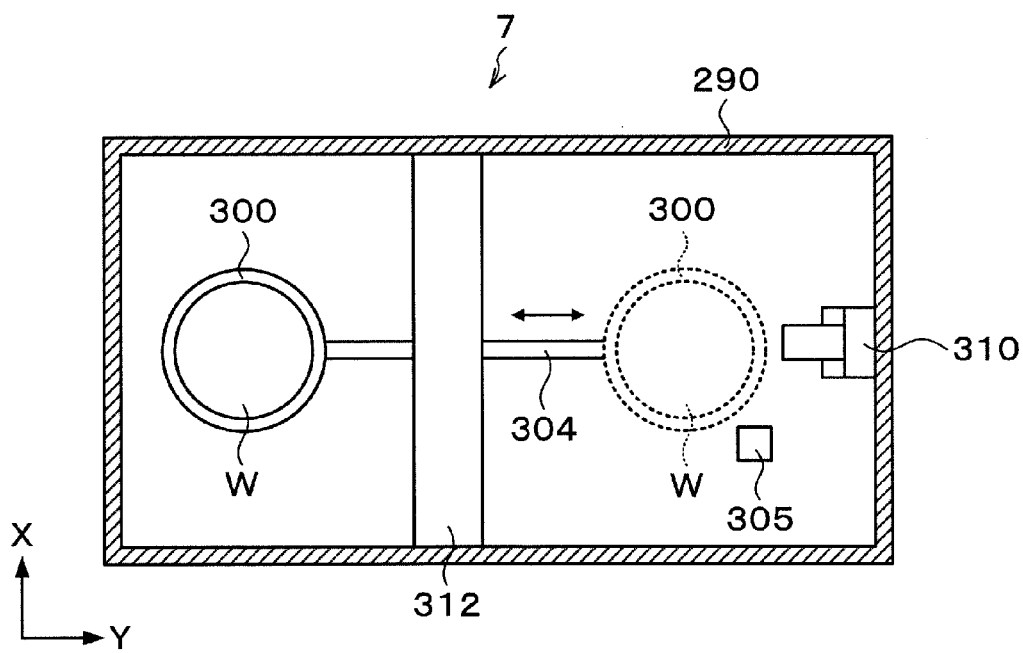
FIG. 11 is a transverse sectional view illustrating the outline of the configuration of the inspection apparatus.

Next, the configuration of the aforementioned inspection apparatus 7 will be described. The inspection apparatus 7 has a processing container 290 as illustrated in FIG. 10 and FIG. 11. In a side surface of the processing container 290, a transfer-in/out port (not illustrated) for the processing target wafer W is formed, and an opening/closing shutter (not illustrated) is provided at the transfer-in/out port.

Inside the processing container 290, a porous chuck 300 that holds the processing target wafer W thereon is provided. The porous chuck 300 has a main body unit 301 in a flat plate shape and a porous 302 being a porous body provided on the upper surface side of the main body unit 301. The porous 302 has, for example, substantially the same diameter as that of the processing target wafer W and is in abutment with the non-joint surface $W_N$ of the processing target wafer W. Note that as the porous 302, for example, silicon carbide is used. A suction pipe (not illustrated) is connected to the porous 302 and sucks the non-joint surface $W_N$ of the processing target wafer W from the suction pipe via the porous 302 and thereby can suction-hold the processing target wafer W on the porous chuck 300.

Below the porous chuck 300, a chuck driving unit 303 is provided. The porous chuck 300 can freely rotate by means of the chuck driving unit 303. Further, the chuck driving unit 303 is attached to the top of a rail 304 provided at the bottom surface inside the processing container 290 and extending along the Y-direction. By means of the chuck driving unit 303, the porous chuck 300 can move along the rail 304. More specifically, the porous chuck 300 can move between a delivery position P1 for transferring in/out the processing target wafer W to/from the outside of the processing container 290 and an alignment position P2 where the position of a notch portion of the processing target wafer W is adjusted.

At the alignment position P2, a sensor 305 is provided which detects the position of the notch portion of the processing target wafer W held on the porous chuck 300. The chuck driving unit 303 rotates the porous chuck 300 while the sensor 305 is detecting the position of the notch portion, and thereby can adjust the position of the notch portion of the processing target wafer W.

On a side surface on the alignment position P2 side in the processing container 290, an imaging apparatus 310 is provided. As the imaging apparatus 310, for example, a wide-angle CCD camera is used. Near the middle of the upper portion of the processing container 290, a half mirror 311 is provided. The half mirror 311 is provided at a position facing the imaging apparatus 310, and inclined at 45 degrees from the vertical direction. An illumination apparatus 312 that can change in illuminance is provided above the half mirror 311, and the half mirror 311 and the illumination apparatus 312 are fixed to the upper surface of the processing container 290. Further, the imaging apparatus 310, the half mirror 311, and the illumination apparatus 312 are provided above the processing target wafer W held on the porous chuck 300. The illumination from the illumination apparatus 312 passes through the half mirror 311 and is applied downward. Accordingly, reflection light from an object existing in an irradiation area thereof is reflected off the half mirror 311 and is taken into the imaging apparatus 310. In other words, the imaging apparatus 310 can capture an image of the object existing in the illumination area. The captured image of the processing target wafer W is then outputted to the later-described control unit 350. The control unit 350 inspects the presence or absence of a residue of the adhesive G on the processing target wafer W.

In the above separation system 1, the control unit 350 is provided as illustrated in FIG. 1. The control unit 350 is, for example, a computer and has a program storage unit (not illustrated). In the program storage unit, a program is stored which controls the processing of the processing target wafer W, the supporting wafer S, and the superposed wafer T in the separation system 1. Further, the program storage unit also stores a program for controlling the operation of the driving system such as the above-described various processing and treatment apparatuses and transfer apparatuses to implement the later-described separation processing in the separation system 1. Note that the program may be the one that is stored, for example, in a computer-readable storage medium H such as a computer-readable hard disk (HD), flexible disk (FD), compact disk (CD), magneto-optical disk (MO), or memory card, and installed from the storage medium H into the control unit 350.

Figure 12:
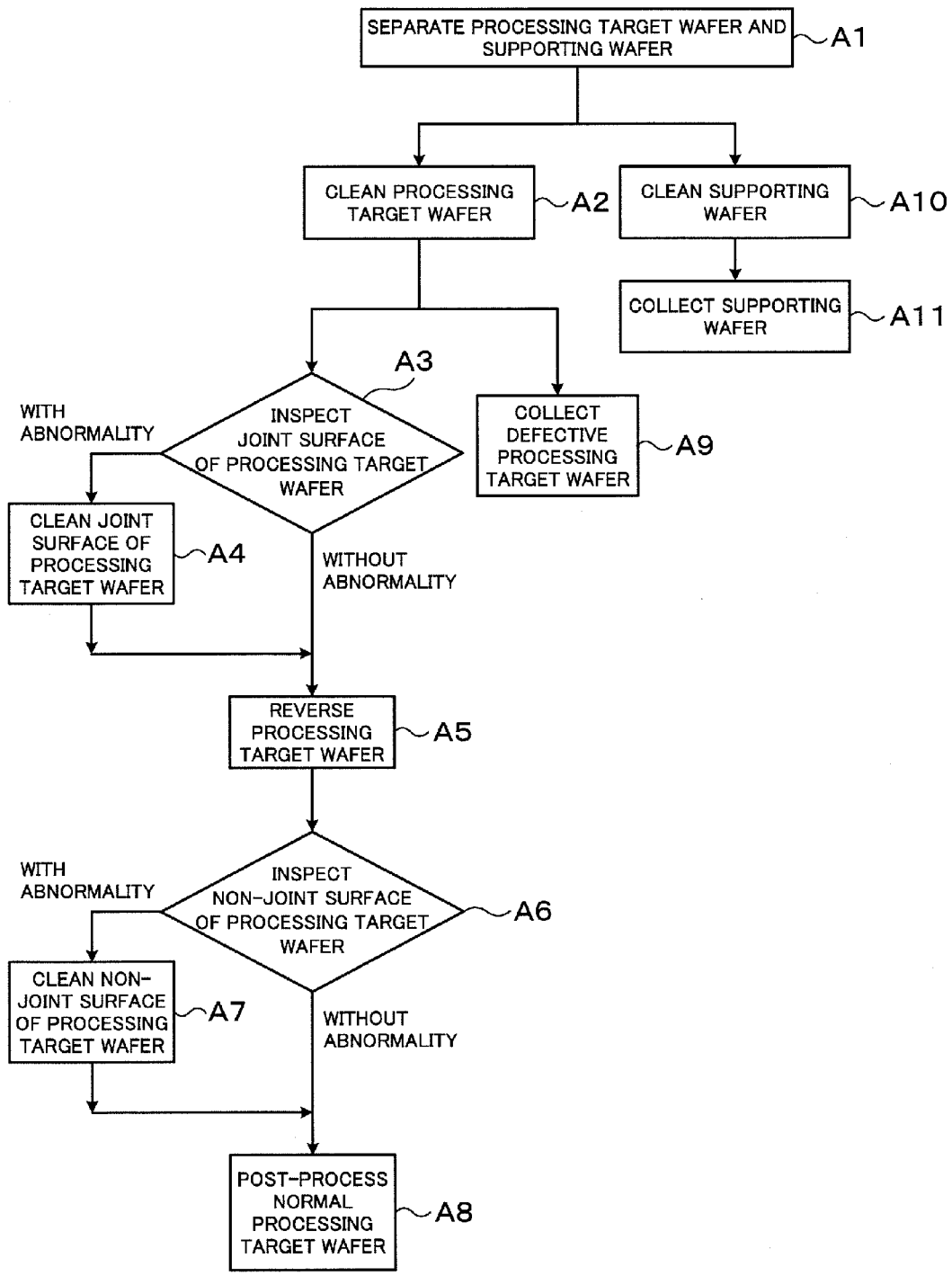
FIG. 12 is a flowchart illustrating main steps of separation processing.

Next, the separation processing method of the processing target wafer W and the supporting wafer S performed using the separation system 1 configured as described above will be described. FIG. 12 is a flowchart illustrating an example of main steps of the separation processing.

First, a cassette $C_T$ housing a plurality of superposed wafers T, an empty cassette $C_W$, and an empty cassette $C_S$ are mounted on the predetermined cassette mounting plates 11 in the transfer-in/out station 2. The superposed wafer T in the cassette $C_T$ is taken out by the first transfer apparatus 20 and transferred to the separation apparatus 30 in the processing station 3. In this event, the superposed wafer T is transferred with the processing target wafer W arranged on the upper side and the supporting wafer S arranged on the lower side.

Figure 13:
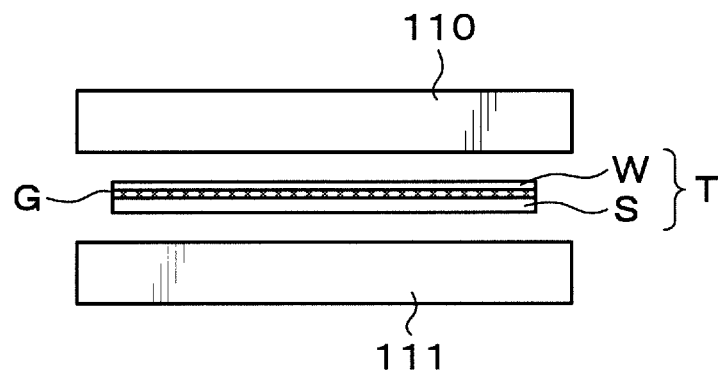
FIG. 13 is an explanatory view illustrating the appearance in which a superposed wafer is pre-heated.

The superposed wafer T transferred in the separation apparatus 30 is delivered to the raising and lowering pins (not illustrated) which have been raised in advance. The superposed wafer T is then located at a position between the first holding unit 110 and the second holding unit 111 where the superposed wafer T does not come into contact with any of the first holding unit 110 and the second holding unit 111 as illustrated in FIG. 13. After a lapse of a predetermined time in this state, the superposed wafer T is pre-heated by the heating mechanisms 124, 141. The pre-heating makes it possible to suppress the thermal expansion of the processing target wafer W even when the processing target wafer W is suction-held and heated on the first holding unit 110 as described later. Therefore, it is possible to further suppress the warpage of the processing target wafer W and the particles generated due to rubbing of the processing target wafer W on the first holding unit 110 in this embodiment than in the prior art in which the processing target wafer at room temperature is heated on the first holding unit.

Figure 14:
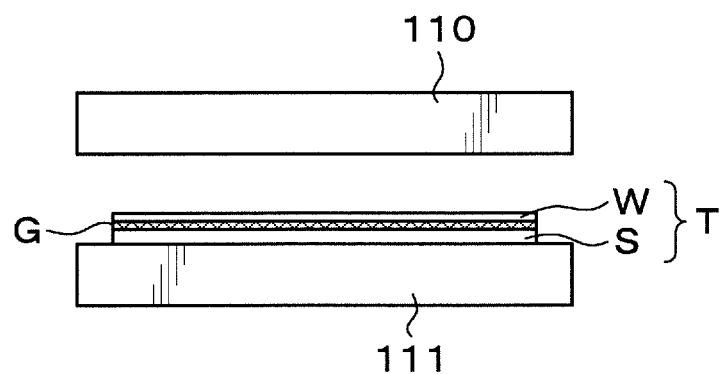
FIG. 14 is an explanatory view illustrating the appearance in which the superposed wafer is mounted on a second holding unit.
Figure 15:
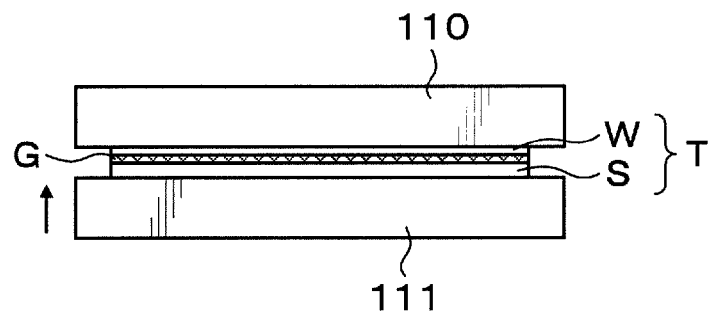
FIG. 15 is an explanatory view illustrating the appearance in which the superposed wafer is held by a first holding unit and the second holding unit.

Thereafter, the superposed wafer T is suction-held on the second holding unit 111 as illustrated in FIG. 14. Then, after a lapse of a predetermined time, the superposed wafer T is heated by the heating mechanisms 124, 141 to a predetermined temperature, for example, 200° C. to 250° C. Then, the adhesive G in the superposed wafer T becomes softened. Thereafter, the second holding unit 111 is raised by the moving mechanism 150 so that the superposed wafer T is held sandwiched between the first holding unit 110 and the second holding unit 111 as illustrated in FIG. 15. In this event, the non-joint surface $W_N$ of the processing target wafer W is suction-held by the first holding unit 110, and the non-joint surface $S_N$ of the supporting wafer S is suction-held by the second holding unit 111.

Figure 16:
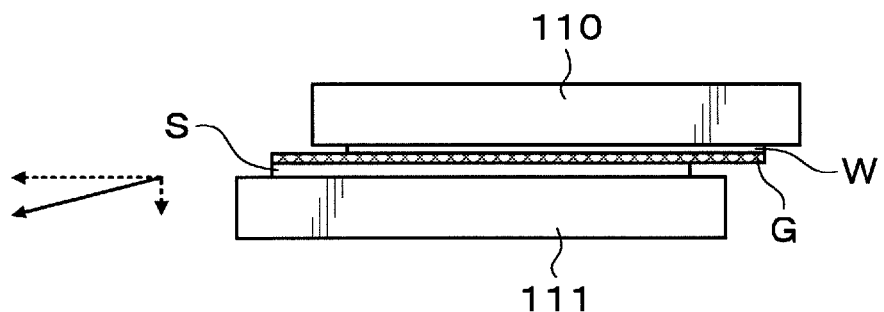
FIG. 16 is an explanatory view illustrating the appearance in which the second holding unit is moved in the vertical direction and the horizontal direction.
Figure 17:
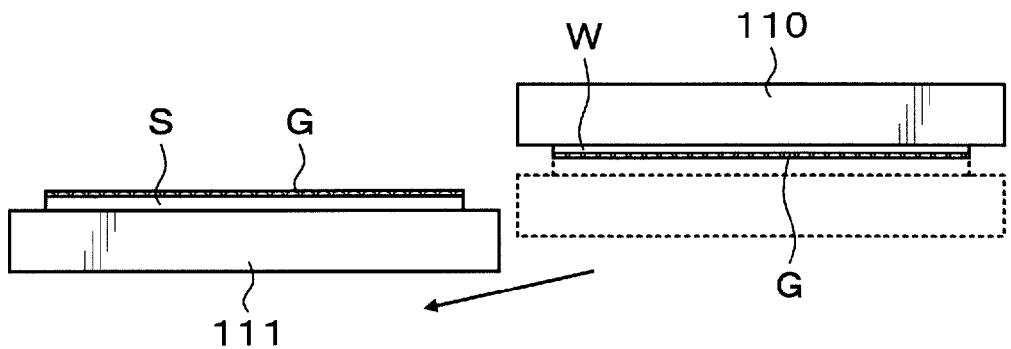
FIG. 17 is an explanatory view illustrating the appearance in which the processing target wafer and the supporting wafer have been separated.

Subsequently, while the heating mechanisms 124, 141 are heating the superposed wafer T to keep the softened state of the adhesive G, the second holding unit 111 and the supporting wafer S are moved by the moving mechanism 150 in the vertical direction and the horizontal direction, namely, obliquely downward as illustrated in FIG. 16. Then, the processing target wafer W held by the first holding unit 110 and the supporting wafer S held by the second holding unit 111 are separated as illustrated in FIG. 17 (step A1 in FIG. 12).

In step A1, the load cell 180 measures the load acting on the processing target wafer W and the supporting wafer S. The load measured by the load cell 180 is then outputted to the later-described control unit 350. The control unit 350 controls the rotation speed (or torque) of the driving unit 173 based on the load measured by the load cell 180 so that the load acting on the processing target wafer W and the supporting wafer S is a constant desired load, for example, 500 N to 1000 N. Then, the moving speed of the supporting body 171 is low and the separation speed of the processing target wafer W and the supporting wafer S is low (for example, 1 mm/sec) at an initial stage of the separation processing, but the moving speed of the supporting body 171 increases and the separation speed increases (for example, 15 to 16 mm/sec) as the separation processing proceeds. Note that as the desired load, an appropriate load is set according to the kinds of the devices on the processing target wafer W, the processing performed on the processing target wafer W, and the kind of the adhesive G.

Here, if the load acting on the processing target wafer W and the supporting wafer S is too high, the devices on the processing target wafer W may be damaged. In addition, if the load is too high, the control unit 350 may detect abnormality and stop the operation of the separation apparatus 30. On the other hand, if the load acting on the processing target wafer W and the supporting wafer S is too low, a lot of time is required to separate the processing target wafer W and the supporting wafer S. In this embodiment, since the driving unit 173 can be feedback-controlled so that the acting load becomes a desired load, the damage to the processing target wafer W and the supporting wafer S can be suppressed. Further, the separation speed can be increased as the separation processing proceeds to thereby optimally reduce the time required for the separation processing.

Further, in step A1, the second holding unit 111 moves 100 μm in the vertical direction and moves 300 mm in the horizontal direction. Incidentally, in this embodiment, the thickness of the adhesive G in the superposed wafer T is, for example, 30 μm to 40 μm and the height of the devices (bumps) formed on the joint surface $W_J$ of the processing target wafer W is, for example, 20 μm. Accordingly, the distance between the devices on the processing target wafer W and the supporting wafer S is minute. Hence, for example, when the second holding unit 111 is moved only in the horizontal direction, the devices and the supporting wafer S can come into contact with each other, whereby the devices may be damaged. In this regard, moving the second holding unit 111 in the horizontal direction and also in the vertical direction as in this embodiment can prevent the contact between the devices and the supporting wafer S to suppress the damage to the devices. Note that the ratio between the moving distance in the vertical direction and the moving distance in the horizontal direction of the second holding unit 111 is set based on the height of the devices (bumps) on the processing target wafer W.

Thereafter, the processing target wafer W separated in the separation apparatus 30 is transferred by the second transfer apparatus 32 to the first cleaning apparatus 31. Here, the transfer method of the processing target wafer W by the second transfer apparatus 32 will be described.

Figure 18:
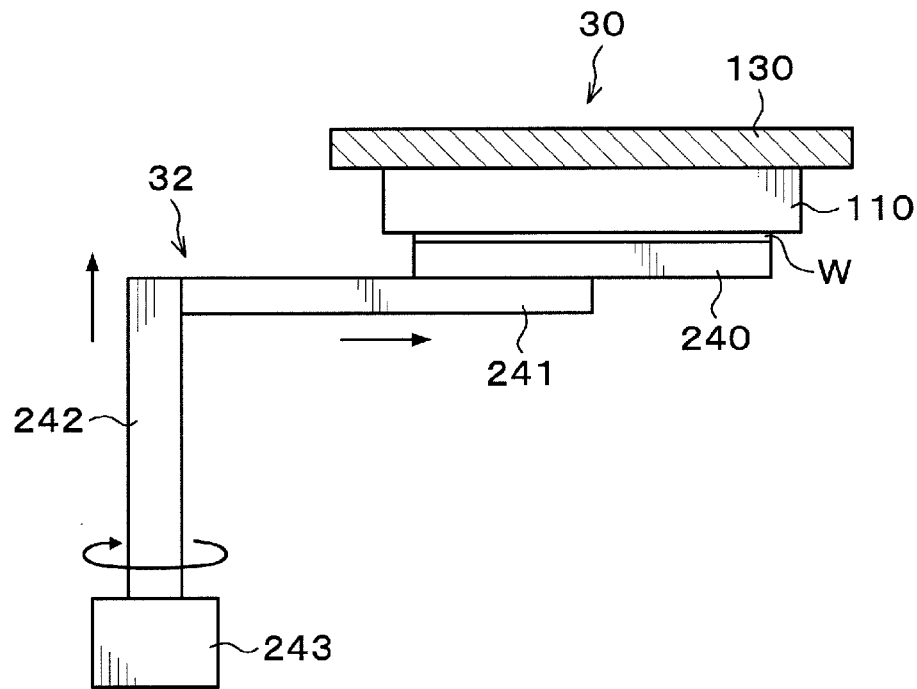
FIG. 18 is an explanatory view illustrating the appearance in which the processing target wafer is delivered from the first holding unit of the separation apparatus to a Bernoulli chuck of the second transfer apparatus.

The supporting arm 241 of the second transfer apparatus 32 is extended to locate the Bernoulli chuck 240 below the processing target wafer W held by the first holding unit 110 as illustrated in FIG. 18. Thereafter, the Bernoulli chuck 240 is raised, and the suction of the processing target wafer W from the suction pipe 123 at the first holding unit 110 is stopped. Then, the processing target wafer W is delivered from the first holding unit 110 to the Bernoulli chuck 240. Thereafter, the Bernoulli chuck 240 is lowered to a predetermined position. Note that the processing target wafer W is held by the Bernoulli chuck 240 in a manner not in contact therewith. Therefore, the processing target wafer W is held with the devices on the joint surface $W_J$ of the processing target wafer W being never damaged. Note that the second holding unit 111 is moved to a position facing the first holding unit 110 in this event.

Figure 19:
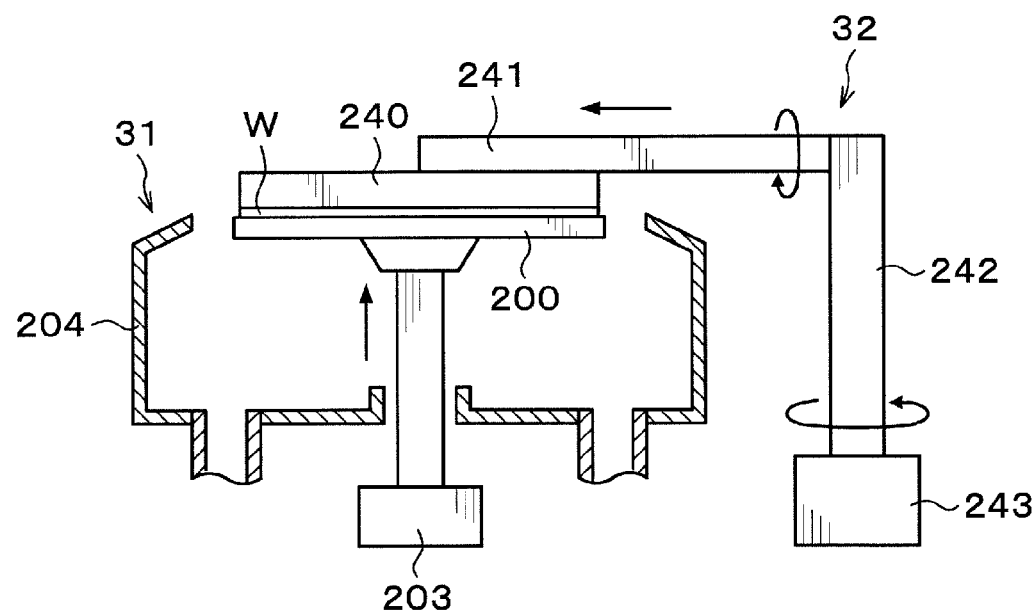
FIG. 19 is an explanatory view illustrating the appearance in which the processing target wafer is delivered from the Bernoulli chuck of the second transfer apparatus to a porous chuck of the first cleaning apparatus.

Next, as illustrated in FIG. 19, the supporting arm 241 of the second transfer apparatus 32 is turned to move the Bernoulli chuck 240 to above the porous chuck 200 in the first cleaning apparatus 31 and reverse the Bernoulli chuck 240 to thereby direct the processing target wafer W downward. In this event, the porous chuck 200 is raised to a position upper than the cup 204 and kept waiting. Thereafter, the processing target wafer W is delivered from the Bernoulli chuck 240 to the porous chuck 200 and suction-held.

After the processing target wafer W is suction-held on the porous chuck 200 in this manner, the porous chuck 200 is lowered to a predetermined position. Subsequently, the arm 211 moves the cleaning solution nozzle 212 at the waiting section 214 to a position above the central portion of the processing target wafer W. Thereafter, while the porous chuck 200 is rotating the processing target wafer W, the cleaning solution is supplied from the cleaning solution nozzle 212 to the joint surface $W_J$ of the processing target wafer W. The supplied cleaning solution is diffused over the entire joint surface $W_J$ of the processing target wafer W by the centrifugal force, whereby the joint surface $W_J$ of the processing target wafer W is cleaned (step A2 in FIG. 12).

Here, the plurality of superposed wafers T transferred in the transfer-in/out station 2 have been subjected to inspection in advance as described above and discriminated between a superposed wafer T including a normal processing target wafer W and a superposed wafer T including a defective processing target wafer W.

The normal processing target wafer W separated from the normal superposed wafer T is cleaned at its joint surface $W_J$ in step A2 and then transferred with the non-joint surface $W_N$ directed downward, by the third transfer apparatus 51 to the inspection apparatus 7. Note that the transfer of the processing target wafer W by the third transfer apparatus 51 is substantially the same as the above-described transfer of the processing target wafer W by the second transfer apparatus 32, and therefore the description thereof is omitted.

The processing target wafer W transferred to the inspection apparatus 7 is held on the porous chuck 300 at the delivery position P1. Subsequently, the chuck driving unit 303 moves the porous 300 to the alignment position P2. Then, while the sensor 305 is detecting the position of the notch portion of the processing target wafer W, the chuck driving unit 303 rotates the porous chuck 300. Then, the position of the notch portion of the processing target wafer W is adjusted, whereby the processing target wafer W is located in a predetermined orientation.

Thereafter, the chuck driving unit 303 moves the porous 300 from the alignment position P2 to the delivery position P1. Then, illumination is applied from the illumination apparatus 312 to the processing target wafer W when the processing target wafer W passes under the half mirror 311. The light by the illumination reflected off the top of the processing target wafer W is taken into the imaging apparatus 310, so that an image of the joint surface $W_J$ of the processing target wafer W is captured in the imaging apparatus 310. The captured image of the joint surface $W_J$ of the processing target wafer W is outputted to the control unit 350, and the control unit 350 inspects the presence or absence of a residue of the adhesive G on the joint surface $W_J$ of the processing target wafer W (step A3 in FIG. 12).

If a residue of the adhesive G is verified in the inspection apparatus 7, the processing target wafer W is transferred by the third transfer apparatus 51 to the joint surface cleaning apparatus 40 in the post-inspection cleaning station 8, and the adhesive G on the joint surface $W_J$ is removed in the joint surface cleaning apparatus 40 (step A4 in FIG. 12). Note that step A4 is the same as the above-described step A2, and the description thereof is omitted. Further, for example, if it is verified that there is no residue of the adhesive G in the inspection apparatus 7, step A4 may be omitted.

After the joint surface $W_J$ is cleaned, the processing target wafer W is transferred by the third transfer apparatus 51 to the reversing apparatus 42, and its front and rear surfaces are reversed, namely, reversed in the top-bottom direction by the reversing apparatus 42 (step A5 in FIG. 12). The reversing method of the processing target wafer W by the reversing apparatus 42 will be described here.

Figure 20:
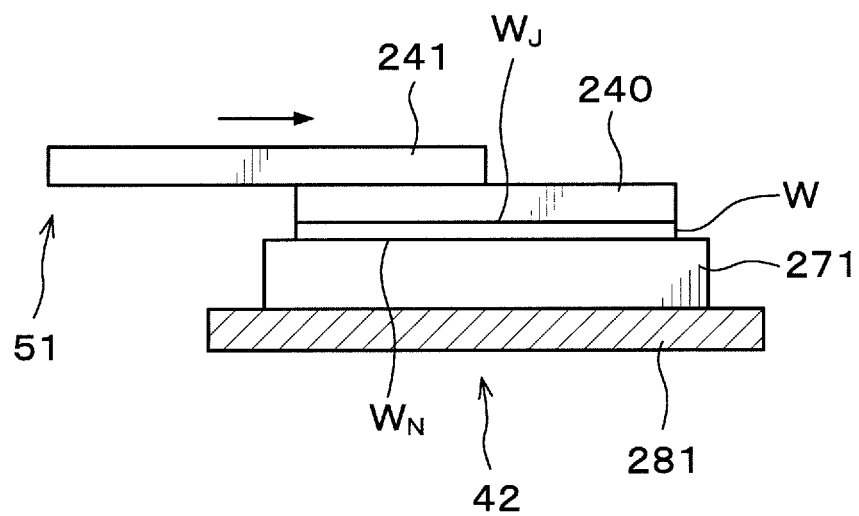
FIG. 20 is an explanatory view illustrating the appearance in which the processing target wafer is delivered from a Bernoulli chuck of a third transfer apparatus to a second holding unit of the reversing apparatus.

The processing target wafer W having the joint surface $W_J$ cleaned in the joint surface cleaning apparatus 40 is transferred to the reversing apparatus 42 with the joint surface $W_J$ being held by the Bernoulli chuck 240 of the third transfer apparatus 51 as illustrated in FIG. 20. Then, the processing target wafer W is delivered to the second holding unit 271 of the reversing apparatus 42 with the joint surface $W_J$ directed upward, and the entire non-joint surface $W_N$ of the processing target wafer W is held by the second holding unit 271.

Figure 21:
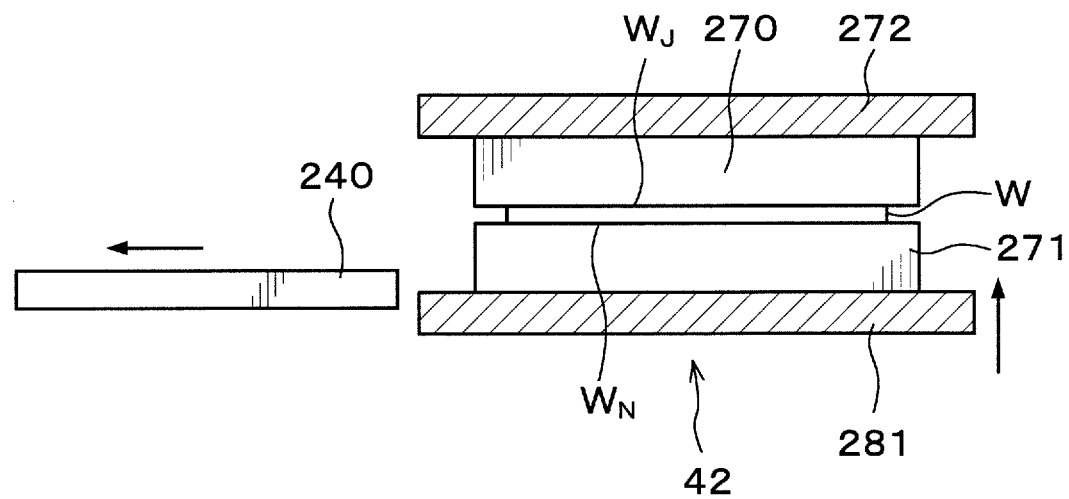
FIG. 21 is an explanatory view illustrating the appearance in which the processing target wafer is delivered from the second holding unit of the reversing apparatus to the first holding unit.
Figure 22:
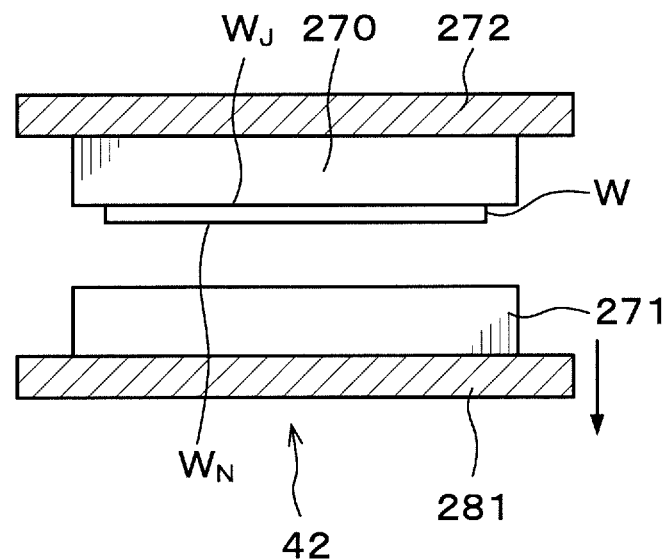
FIG. 22 is an explanatory view illustrating the state in which the processing target wafer has been delivered from the second holding unit of the reversing apparatus to the first holding unit.

Then, the Bernoulli chuck 240 of the third transfer apparatus 51 is retracted from above the second holding unit 271, and the second holding unit 271 is raised, in other words, made to approach to the first holding unit 270 by the driving unit 282 as illustrated in FIG. 21. Then, the joint surface $W_J$ of the processing target wafer W is held by the first holding unit 270 and the holding of the processing target wafer W by the second holding unit 271 is stopped to deliver the processing target wafer W to the first holding unit 270. Thus, the processing target wafer W is held by the first holding unit 270 with the non-joint surface $W_N$ directed downward as illustrated in FIG. 22.

Figure 23:
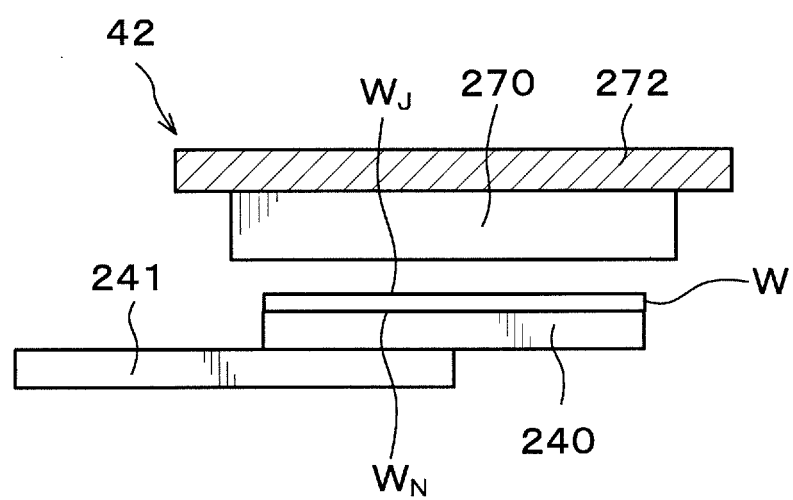
FIG. 23 is an explanatory view illustrating the state in which the processing target wafer has been delivered from the first holding unit of the reversing apparatus to the Bernoulli chuck of the third transfer apparatus.

Thereafter, the second holding unit 271 is lowered to separate the first holding unit 270 and the second holding unit 271, and the retracted Bernoulli chuck 240 of the third transfer apparatus 51 is then turned around the horizontal axis. Then, with the Bernoulli chuck 240 directed upward, the Bernoulli chuck 240 is located below the first holding unit 270. Then, the Bernoulli chuck 240 is raised, and the holding of the processing target wafer W by the first holding unit 270 is stopped concurrently therewith. Thereby the processing target wafer W having the joint surface $W_J$ held by the Bernoulli chuck 240 when transferred into the joint surface cleaning apparatus 40 is brought into a state in which the non-joint surface $W_N$ is held by the Bernoulli chuck 240 as illustrated in FIG. 23. In other words, the processing target wafer W is brought into a state in which the surface of the processing target wafer held by the Bernoulli chuck 240 is changed from front to rear. Thereafter, the Bernoulli chuck 240 holding the non-joint surface $W_N$ of the processing target wafer W is retracted from the reversing apparatus 42.

Note that if a residue of the adhesive G is not verified in the inspection apparatus 7, the processing target wafer W is subjected to the reversal in the reversing apparatus 42 without being transferred to the joint surface cleaning apparatus 40. The reversing method is the same as the above-described method.

Thereafter, the Bernoulli chuck 240 of the third transfer apparatus 51 holding the processing target wafer W is turned around the horizontal axis to reverse the processing target wafer W in the top-bottom direction. Then, the processing target wafer W with the non-joint surface $W_N$ directed upward is transferred by the Bernoulli chuck 240 again to the inspection apparatus 7, and the non-joint surface $W_N$ is inspected (step A6 in FIG. 12). Then, when the contamination such as particles is verified on the non-joint surface $W_N$, the processing target wafer W is transferred by the third transfer apparatus 51 to the non-joint surface cleaning apparatus 41, and the non-joint surface $W_N$ is cleaned by the non-joint surface cleaning apparatus 41 (step A7 in FIG. 12). Note that step A7 is the same as the above-described step A2, and therefore the description thereof is omitted. Further, for example, if it is verified that there is no residue of the adhesive G in the inspection apparatus 7, step A7 may be omitted.

Then, the cleaned processing target wafer W is transferred by the third transfer apparatus 51 to the post-processing station 4. Note that if a residue of the adhesive G is not verified in the inspection apparatus 7, the processing target wafer W is transferred to the post-processing station 4 as it is without being transferred to the non-joint surface cleaning apparatus 41.

Thereafter, predetermined post-processing is performed on the processing target wafer W in the post-processing station 4 (step A8 in FIG. 12). In this manner, the processing target wafer W becomes a product.

On the other hand, the defective processing target wafer W separated from the defective superposed wafer T is cleaned at its joint surface $W_J$ in step A2 and then transferred by the first transfer apparatus 20 to the transfer-in/out station 2. Thereafter, the defective processing target wafer W is transferred from the transfer-in/out station 2 to the outside and collected (step A9 in FIG. 12).

While the above-described steps A2 to A9 are being performed on the processing target wafer W, the supporting wafer S separated in the separation apparatus 30 is transferred by the first transfer apparatus 20 to the second cleaning apparatus 33. Then, in the second cleaning apparatus 33, the adhesive on the joint surface $S_J$ of the supporting wafer S is removed, whereby the joint surface $S_J$ is cleaned (step A10 in FIG. 12). Note that the cleaning of the supporting wafer S in step A10 is the same as the removal of the adhesive G on the processing target wafer W in the above-described step A2, and therefore the description thereof is omitted.

Thereafter, the supporting wafer S whose joint surface $S_J$ has been cleaned is transferred by the first transfer apparatus 20 to the transfer-in/out station 2. Then, the supporting wafer S is transferred from the transfer-in/out station 2 to the outside and collected (step A11 in FIG. 12). Thus, a series of separation processing of the processing target wafer W and the supporting wafer S ends.

According to the above embodiment, the load cell 180 measures the load acting on the processing target wafer W and the supporting wafer S at separation of the processing target wafer W and the supporting wafer S. The load measured by the load cell 180 is then outputted to the control unit 350. The control unit 350 controls the rotation speed (or torque) of the driving unit 173 based on the load measured by the load cell 180 so that the load acting on the processing target wafer W and the supporting wafer S is a constant desired load. Since the driving unit 173 can be feedback-controlled as in the above manner, an appropriate load can be made to act on the processing target wafer W and the supporting wafer S. As a result, the damage to the processing target wafer W and the supporting wafer S can be suppressed. Further, the separation speed can be increased as the separation processing proceeds to optimally reduce the time required for the separation processing of separating the processing target wafer W and the supporting wafer S, thereby improving the throughput of the separation processing. As described above, according to this embodiment, the separation processing of the processing target wafer W and the supporting wafer S can be appropriately and efficiently performed.

In the separation system 1 in the above embodiment, after the superposed wafer T is separated into the processing target wafer W and the supporting wafer S in the separation unit 30, the separated processing target wafer W can be cleaned in the first cleaning unit 31 and the separated supporting wafer S can be cleaned in the second cleaning unit 33. As described above, according to this embodiment, a series of separation processing from the separation of the processing target wafer W and the supporting wafer S to the cleaning of the processing target wafer W and the cleaning of the supporting wafer S can be efficiently performed in one separation system 1. Further, the cleaning of the processing target wafer W and the cleaning of the supporting wafer S can be concurrently performed in the first cleaning unit 31 and the second cleaning unit 33 respectively. Further, while the processing target wafer W and the supporting wafer S are being separated in the separation unit 30, other processing target wafer W and supporting wafer S can be processed in the first cleaning unit 31 and the second cleaning unit 33. Therefore, it is possible to efficiently perform the separation of the processing target wafer W and the supporting wafer S and thereby improve the throughput of the separation processing.

Further, since the separation of the processing target wafer W and the supporting wafer S to the post-processing of the processing target wafer W can be performed in a series of processes as described above, the throughput of the wafer processing can further be improved When the load measured by the load cell 180 exceeds an allowable load in the separation apparatus 30 of the above embodiment, the driving of the driving unit 173 may be stopped. For example, when abnormality has occurred in the separation processing of the processing target wafer W and the supporting wafer S and the load measured by the load cell 180 has rapidly increased, the control unit 350 controls the driving unit 173 to stop the driving of the driving unit 173. In this case, the damage to the processing target wafer W and the supporting wafer S can be more surely suppressed.

Though the second holding unit 111 is moved in the vertical direction and the horizontal direction in the separation apparatus 30 in the above embodiment, the first holding unit 110 may be moved in the vertical direction and the horizontal direction. Alternatively, both of the first holding unit 110 and the second holding unit 111 may be moved in the vertical direction and the horizontal direction.

Further, though the second holding unit 111 is moved in the vertical direction and the horizontal direction in the above separation apparatus 30 in the above embodiment, the second holding unit 111 may be moved only in the horizontal direction, for example, when the distance between the devices on the processing target wafer W and the supporting wafer S is large enough. In this case, it is possible to avoid the contact between the devices and the supporting wafer S and facilitate the control of the movement of the second holding unit 111. Further, the second holding unit 111 may be moved only in the vertical direction to separate the processing target wafer W and the supporting wafer S.

In the separation apparatus 30 in the above embodiment, a cover (not illustrated) that covers the processing space between the first holding unit 110 and the second holding unit 111 may be provided. In this case, the processing space is brought into an atmosphere of an inert gas, thereby making it possible to suppress formation of an oxide film on the predetermined devices on the joint surface $W_J$ of the processing target wafer W even when the processing target wafer W is subjected to heat processing.

Further, a porous plate (not illustrated) that is movable in the horizontal direction following the second holding unit 111 and supplies an inert gas from a plurality of pores may be provided in the separation apparatus 30 in the above embodiment. In this case, at the time when moving the second holding unit 111 to separate the superposed wafer T, the inert gas is supplied to the joint surface $W_J$ of the processing target wafer W which has been exposed by the separation while the porous plate is being moved following the second holding unit 111. This makes it possible to suppress formation of the oxide film on the devices on the joint surface $W_J$ of the processing target wafer W even when the processing target wafer W is subjected to heat processing.

Note that though the processing target wafer W and the supporting wafer S are separated with the processing target wafer W arranged on the upper side and the supporting wafer S arranged on the lower side in the separation apparatus 30 in the above embodiment, the upper and lower arrangement of the processing target wafer W and the supporting wafer S may be reversed.

Though the load cell 180 as a load measurement unit that measures the load acting on the processing target wafer W and the supporting wafer S is provided in the separation apparatus 30 in the above embodiment, the load measurement unit is not limited to the load cell, but various means can be used. For example, a pressure sensor, a dial gauge, a spring scale or the like can be used as the load measurement unit.

Figure 24:
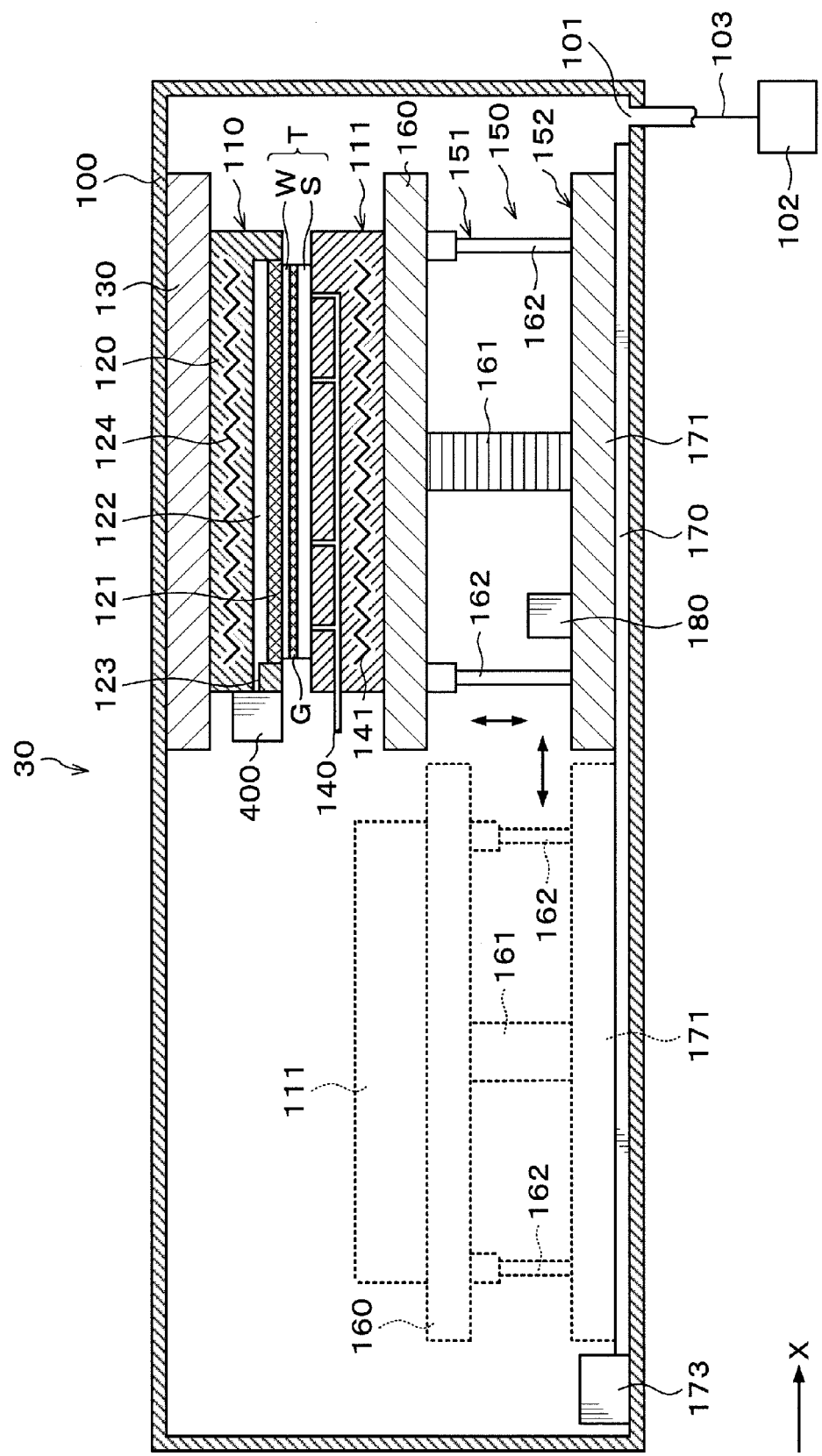
FIG. 24 is a longitudinal sectional view illustrating the outline of a configuration of a separation apparatus according to another embodiment.

The separation apparatus 30 in the above embodiment may have a master load cell 400 as a load calibration unit for calibrating the load cell 180 as illustrated in FIG. 24. The master load cell 400 is higher in accuracy of measuring the load than the load cell 180. More specifically, the master load cell 400 has been calibrated so that the load measured by the master load cell 400 is identical to the actually acting load. Further, the master load cell 400 is provided, for example, in the first holding unit 110.

In this case, before a processing target wafer W for a product and the supporting wafer S are separated, a processing target wafer W for load calibration and the supporting wafer S are separated. Then, the load measured by the load cell 180 is compared with the load measured by the master load cell 400, and the load measured by the load cell 180 is calibrated based on the master load cell 400.

According to this embodiment, since the calibration of the load cell 180 is performed using the master load cell 400, the load when actually separating the processing target wafer W for a product and the supporting wafer S can be more accurately measured using the load cell 180. As a result, it is possible to more appropriately perform the feedback control of the driving unit 173, and to appropriately and efficiently perform the separation processing of the processing target wafer W and the supporting wafer S. In particular, the separation processing of the processing target wafer W and the supporting wafer S performed in the separation apparatus 30 is the processing at the final stage performed on the processing target wafer W as a product, and therefore if the processing target wafer W is damaged, all the processing so far is wasted. Therefore, it is important to measure the adequate load by the load cell 180 and appropriately perform the separation processing of the processing target wafer W and the supporting wafer S.

Note that though the master load cell 400 is provided as a load calibration unit in the separation apparatus 30 in this embodiment, the load calibration unit is not limited to the master load cell, but various means can be used. For example, a pressure sensor, a dial gauge, a spring scale or the like can be used as the load calibration unit.

Though the two-fluid nozzle is used as the cleaning solution nozzle 212 in the first cleaning apparatus 31, the second cleaning apparatus 33, the joint surface cleaning apparatus 40, and the non-joint surface cleaning apparatus 41 in the above embodiment, the embodiment of the cleaning solution nozzle 212 is not limited to this embodiment, but various nozzles can be used. For example, as the cleaning solution nozzle 212, a nozzle body made by uniting a nozzle that supplies an organic solvent and a nozzle that supplies an inert gas together, or a spray nozzle, a jet nozzle, a mega-sonic nozzle may be used. Further, to improve the throughput of the cleaning treatment, for example, a cleaning solution heated to 80° C. may be supplied.

Further, a nozzle that supplies IPA (isopropyl alcohol) may be provided in addition to the cleaning solution nozzle 212, in the first cleaning apparatus 31, the second cleaning apparatus 33, the joint surface cleaning apparatus 40, and the non-joint surface cleaning apparatus 41. In this case, after the processing target wafer W or the supporting wafer S is cleaned with the cleaning solution from the cleaning solution nozzle 212, the cleaning solution on the processing target wafer W or the supporting wafer S is replaced with IPA. Thus, the joint surface $W_J$, $S_J$ of the processing target wafer W or the supporting wafer S is more surely cleaned.

Further, the configuration of the inspection apparatus 7 is not limited to that in the above embodiment. The inspection apparatus 7 can take various configurations as long as it can capture an image of the processing target wafer W and inspect the presence or absence of a residue of the adhesive G and the presence or absence of a residue of the oxide film on the processing target wafer W.

A temperature adjusting device (not illustrated) cooling the processing target wafer W heated in the separation apparatus 30 down to a predetermined temperature may be provided in the separation system 1 in the above embodiment. In this case, since the temperature of the processing target wafer W is adjusted to an appropriate temperature, subsequent processing can be more smoothly performed.

At the superposed wafer T in this embodiment, a protecting member for suppressing the damage to the superposed wafer T, for example, a dicing frame (not illustrated) may be provided. The dicing frame is provided on the processing target wafer W side. Also after the processing target wafer W is separated from the supporting wafer S, the thinned processing target wafer W is subjected to predetermined processing and transfer in a state that it is protected by the dicing frame. Accordingly, the damage to the processing target wafer W after the separation can be suppressed.

Though the case of performing post-processing on the processing target wafer W in the post-processing station 4 into a product has been described in the above embodiment, the present invention is also applicable to the case where a processing target wafer used, for example, in the three-dimensional integration technique is separated from a supporting wafer. Note that the three-dimensional integration technique is the technique responding to the demand for higher integration of semiconductor devices in recent years, which three-dimensionally stacks a plurality of highly integrated semiconductor devices instead of arranging the highly integrated semiconductor devices within a horizontal surface. Also in this three-dimensional integration technique, the reduction in thickness of the processing target wafers to be stacked is required, and the processing target wafer is joined with the supporting wafer and subjected to the predetermined processing.

Figure 25:
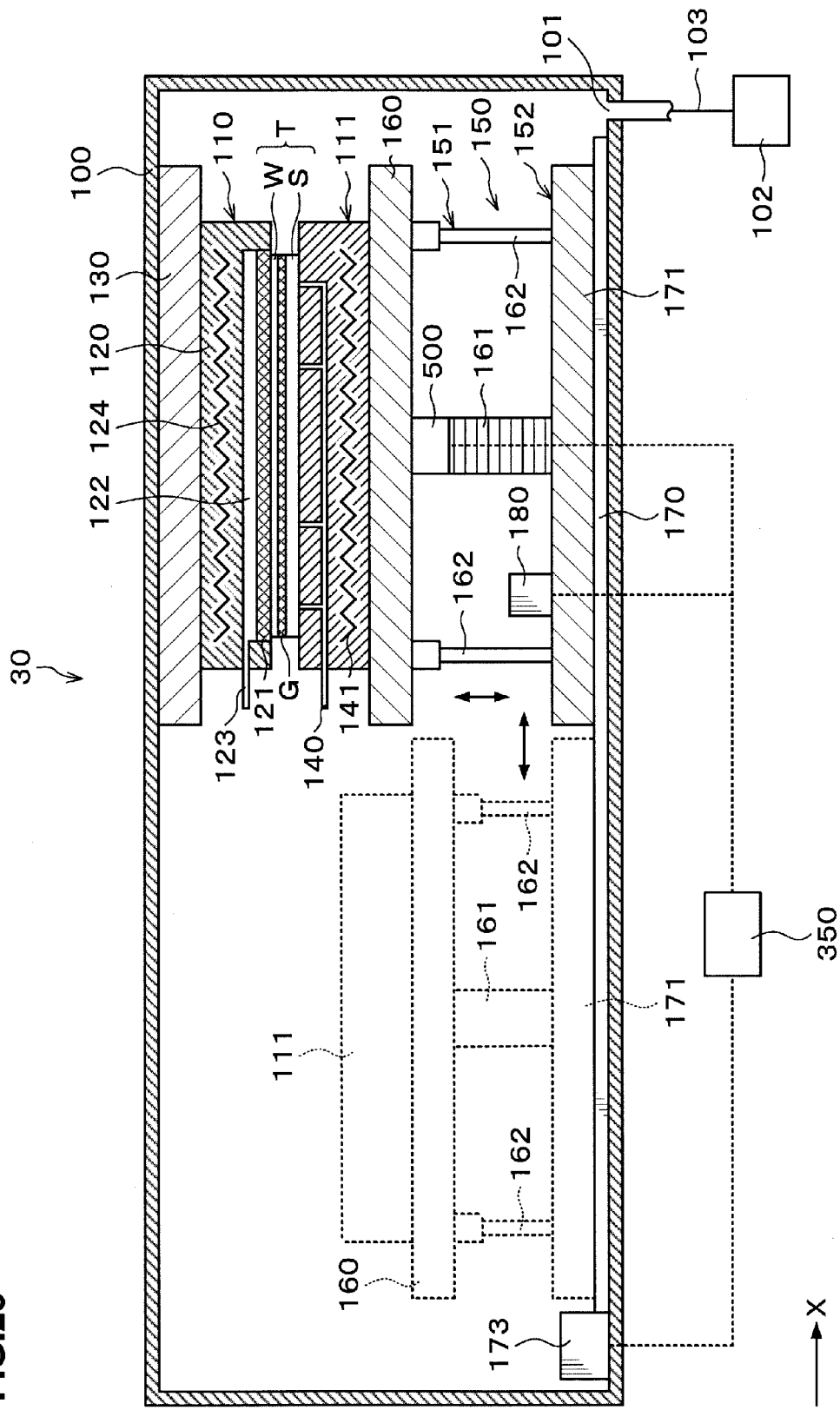
FIG. 25 is a longitudinal sectional view illustrating the outline of a configuration of a separation apparatus according to another embodiment.

Next, another embodiment will be described. The description of the same parts as those in the above embodiment will be omitted. As illustrated in FIG. 25, the separation apparatus 30 further has a load cell 500 as a second load measurement unit in addition to the above-described embodiment. The load cell 500 is provided between the supporting plate 160 and the driving unit 161. The upper end of the load cell 500 is connected to the lower surface of the supporting plate 160, and the lower end of the load cell 500 is connected to the upper end of the driving unit 161. The load cell 500 can measure a load acting in the Z-direction. The load measured by the load cell 500 is outputted to the control unit 350. The control unit 350 controls the rotation speed (or torque) of the driving unit 161 based on the load measured by the load cell 500 so that the load in the Z-direction acting on the processing target wafer W and the supporting wafer S is a constant desired load A. In other words, the control unit 350 controls the driving unit 161 so that the load in the Z-direction is the constant load A. The control unit 350 further controls the rotation speed (or torque) of the driving unit 17 constant 3 based on the load in the X-direction measured by the load cell 180. In other words, the control unit 350 further controls the driving unit 173 so that the load in the X-direction is a constant desired load B. As described above, the control unit 350 performs feedback control both on the driving unit 161 and the driving unit 173. Accordingly, the separation apparatus 30 can make appropriate loads in the X-direction and the Z-direction act on the processing target wafer W and the supporting wafer S respectively. Consequently, it is possible to separate the processing target wafer W and the supporting wafer S without damaging them. Note that the position of the load cell 500 is not limited to a space between the supporting plate 160 and the driving unit 161. The load cell 500 may be provided at any other position where it can measure the load in the Z-direction acting on a vicinity of the center portions of the processing target wafer W and the supporting wafer S. Note that when the load measured by the load cell 500 exceeds an allowable load, the driving of the driving unit 161 may be stopped. Further, the second load measurement unit is not limited to the load cell 500, but various means can be used. For example, a pressure sensor, a dial gauge, a spring scale or other methods can be used as the second load measurement unit.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

What is claimed is:

1. A separation apparatus for separating a superposed substrate in which a processing target substrate and a supporting substrate are joined together with an adhesive, into the processing target substrate and the supporting substrate, the separation apparatus comprising:
   a first holding unit which holds the processing target substrate;
   a second holding unit which holds the supporting substrate;
   a moving mechanism, which includes a horizontal moving unit that moves the first holding unit or the second holding unit in a horizontal direction, and a vertical moving unit that moves the first holding unit or the second holding unit in a vertical direction;
   a control unit which controls operations of the horizontal moving unit and the vertical moving unit; and
   a load measurement unit which measures a load acting on the processing target substrate and the supporting substrate when the processing target substrate and the supporting substrate, which are joined together in the superposed substrate, are being separated from each other by the moving mechanism, the load measurement unit includes
      a first load measurement unit which measures the load acting on the processing target substrate and the supporting substrate in the horizontal direction, the first load measurement unit outputs the load measured in the horizontal direction to the control unit; and
      a second load measurement unit which measures the load acting on the processing target substrate and the supporting substrate in the vertical direction, the second load measurement unit outputs the load measured in the vertical direction to the control unit;
   the control unit controls a rotation speed or torque of the horizontal moving unit, based on feedback of the load measured in the horizontal direction by the first load measurement unit when the processing target substrate and the supporting substrate are being separated from each other, to be a first predetermined load, and
   the control unit controls a rotation speed or torque of the vertical moving unit, based on feedback of the load measured in the vertical direction by the second load measurement unit when the processing target substrate and the supporting substrate are being separated from each other, to be a second predetermined load.

2. The separation apparatus according to claim 1, wherein the control unit controls the moving mechanism so that the load measured by the load measurement unit is constant.

3. The separation apparatus according to claim 1, wherein the control unit controls the moving mechanism to decrease a speed of relative movement of the first holding unit or the second holding unit when the load measured by the load measurement unit exceeds an allowable load.

4. The separation apparatus according to claim 1, wherein the load measurement unit is a load cell.

5. The separation apparatus according to claim 1, further comprising:
   a load calibration unit which is higher in accuracy of measuring the load than the load measurement unit, for performing calibration of the load measurement unit.

6. The separation apparatus according to claim 5, wherein the load calibration unit is a load cell.

7. The separation apparatus according to claim 5, wherein the load calibration unit is a pressure sensor, a dial gauge, or a spring scale.

8. A separation apparatus for separating a superposed substrate in which a processing target substrate and a supporting substrate are joined together with an adhesive, into the processing target substrate and the supporting substrate, the separation apparatus comprising:
   a first holding unit having a lower surface, the lower surface holds the superposed substrate;
   a second holding unit having an upper surface, the upper surface holds the superposed substrate, the superposed substrate is held sandwiched between the first holding unit and the second holding unit;
   a moving mechanism, which includes a horizontal moving unit that moves the first holding unit or the second holding unit in a horizontal direction, and a vertical moving unit that moves the first holding unit or the second holding unit in a vertical direction;
   a control unit which controls operations of the horizontal moving unit and the vertical moving unit; and
   a load measurement unit which measures a load acting on the processing target substrate and the supporting substrate when the processing target substrate and the supporting substrate, which are joined together in the superposed substrate, are being separated from each other by the moving mechanism, the load measurement unit includes
      a first load measurement unit which measures the load acting on the processing target substrate and the supporting substrate in the horizontal direction, the first load measurement unit outputs the load measured in the horizontal direction to the control unit; and
      a second load measurement unit which measures the load acting on the processing target substrate and the supporting substrate in the vertical direction, the second load measurement unit outputs the load measured in the vertical direction to the control unit;
   the control unit controls a rotation speed or torque of the horizontal moving unit, based on feedback of the load measured in the horizontal direction by the first load measurement unit when the processing target substrate and the supporting substrate are being separated from each other, to be a first predetermined load, and
   the control unit controls a rotation speed or torque of the vertical moving unit, based on feedback of the load measured in the vertical direction by the second load measurement unit when the processing target substrate and the supporting substrate are being separated from each other, to be a second predetermined load.

9. The separation apparatus according to claim 8, wherein the control unit controls the moving mechanism so that the load measured by the load measurement unit is constant.

10. The separation apparatus according to claim 8, wherein the control unit controls the moving mechanism to decrease a speed of relative movement of the first holding unit or the second holding unit when the load measured by the load measurement unit exceeds an allowable load.

11. The separation apparatus according to claim 8, wherein the load measurement unit is a load cell.

12. The separation apparatus according to claim 8, further comprising:

a load calibration unit which is higher in accuracy of measuring the load than the load measurement unit, for performing calibration of the load measurement unit.

13. The separation apparatus according to claim 12, wherein the load calibration unit is a load cell.

14. A separation apparatus for separating a superposed substrate in which a processing target substrate and a supporting substrate are joined together with an adhesive, into the processing target substrate and the supporting substrate, the separation apparatus comprising:
   a first holding unit which holds the processing target substrate;
   a second holding unit which holds the supporting substrate;
   a moving mechanism, which includes a horizontal moving unit that moves the first holding unit or the second holding unit in a horizontal direction, and a vertical moving unit that moves the first holding unit or the second holding unit in a vertical direction;
   a control unit which controls operations of the horizontal moving unit and the vertical moving unit; and
   a load measurement unit which measures a load acting on the processing target substrate and the supporting substrate when the processing target substrate and the supporting substrate, which are joined together in the superposed substrate, are being delaminated from each other by the moving mechanism, the load measurement unit includes
      a first load measurement unit which measures the load acting on the processing target substrate and the supporting substrate in the horizontal direction, the first load measurement unit sends feedback to the control unit; and
      a second load measurement unit which measures the load acting on the processing target substrate and the supporting substrate in the vertical direction, the second load measurement unit sends feedback to the control unit;
   the control unit adjusts a rotation speed or torque of the horizontal moving unit, based on the feedback from the first load measurement unit when the processing target substrate and the supporting substrate are being delaminated from each other, and
   the control unit adjusts a rotation speed or torque of the vertical moving unit, based on the feedback from the second load measurement unit when the processing target substrate and the supporting substrate are being delaminated from each other.

15. A separation apparatus for separating a superposed substrate in which a processing target substrate and a supporting substrate are joined together with an adhesive, into the processing target substrate and the supporting substrate, the separation apparatus comprising:
   a first holding unit which holds the processing target substrate;
   a second holding unit which holds the supporting substrate;
   a moving mechanism, which includes a horizontal moving unit that moves the first holding unit or the second holding unit in a horizontal direction, and a vertical moving unit that moves the first holding unit or the second holding unit in a vertical direction;
   a control unit which controls operations of the horizontal moving unit and the vertical moving unit; and
   a load measurement unit which measures a load acting on the processing target substrate and the supporting substrate when the processing target substrate and the supporting substrate, which are joined together in the superposed substrate, are being delaminated from each other by the moving mechanism, the load measurement unit includes
      a first load measurement unit which measures the load acting on the processing target substrate and the supporting substrate in the horizontal direction, the first load measurement unit sends feedback to the control unit that is configured to control a rotation speed or torque of the horizontal moving unit based on the feedback from the first load measurement unit while the processing target substrate and the supporting substrate are being delaminated from each other; and
      a second load measurement unit which measures the load acting on the processing target substrate and the supporting substrate being processed in the vertical direction, the second load measurement unit sends feedback to the control unit that is configured to control a rotation speed or torque of the vertical moving unit based on the feedback from the second load measurement unit while the processing target substrate and the supporting substrate are being delaminated from each other.

* * * * *